(12) United States Patent
Sasago et al.

(10) Patent No.: US 9,153,774 B2
(45) Date of Patent: Oct. 6, 2015

(54) NONVOLATILE MEMORY DEVICE AND METHOD FOR MANUFACTURING SAME

(75) Inventors: Yoshitaka Sasago, Tachikawa (JP); Masaharu Kinoshita, Tsukuba (JP); Mitsuharu Tai, Matsudo (JP); Akio Shima, Hino (JP); Kenzo Kurotsuchi, Kodaira (JP); Takashi Kobayashi, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/884,263

(22) PCT Filed: Dec. 6, 2010

(86) PCT No.: PCT/JP2010/071830
§ 371 (c)(1),
(2), (4) Date: May 8, 2013

(87) PCT Pub. No.: WO2012/077174
PCT Pub. Date: Jun. 14, 2012

(65) Prior Publication Data
US 2013/0228739 A1    Sep. 5, 2013

(51) Int. Cl.
*H01L 27/06* (2006.01)
*H01L 45/00* (2006.01)
*H01L 27/102* (2006.01)
*H01L 29/792* (2006.01)
*H01L 27/24* (2006.01)
*H01L 27/115* (2006.01)
*G11C 13/00* (2006.01)

(52) U.S. Cl.
CPC ............ *H01L 45/04* (2013.01); *H01L 27/0688* (2013.01); *H01L 27/1021* (2013.01); *H01L 27/2409* (2013.01); *H01L 27/2454* (2013.01); *H01L 27/2481* (2013.01); *H01L 29/7926* (2013.01); *H01L 45/16* (2013.01); *G11C 13/0004* (2013.01); *G11C 2213/75* (2013.01); *H01L 27/11578* (2013.01); *H01L 27/11582* (2013.01); *H01L 45/06* (2013.01); *H01L 45/1233* (2013.01); *H01L 45/144* (2013.01)

(58) Field of Classification Search
CPC .................................................. H01L 27/0688
See application file for complete search history.

(56) References Cited

U.S. PATENT DOCUMENTS

2004/0174732 A1    9/2004    Morimoto
2005/0201182 A1    9/2005    Osada et al.

(Continued)

FOREIGN PATENT DOCUMENTS

JP    2004-272975 A    9/2004
JP    2005-260014 A    9/2005

(Continued)

OTHER PUBLICATIONS

Office Action dated Sep. 17, 2013, in Japanese Patent Application No. 2012-547611.

(Continued)

*Primary Examiner* — Matthew Reames
(74) *Attorney, Agent, or Firm* — Miles & Stockbridge P.C.

(57) ABSTRACT

When a thin channel semiconductor layer formed on a side wall of a stacked film in which insulating films and gate electrodes are alternately stacked together is removed on the stacked film, a contact resistance between a vertical transistor including the channel semiconductor layer and the gate electrode, and a bit line formed on the stacked film is prevented from rising. As its means, a conductive layer electrically connected to the channel semiconductor layer is disposed immediately above the stacked film.

9 Claims, 27 Drawing Sheets

(56) References Cited

U.S. PATENT DOCUMENTS

| 2008/0149913 | A1 | 6/2008 | Tanaka et al. |
| 2010/0044776 | A1 | 2/2010 | Ishiduki et al. |
| 2010/0182828 | A1 | 7/2010 | Shima et al. |

FOREIGN PATENT DOCUMENTS

| JP | 2008-160004 | A | | 7/2008 |
| JP | 2009-158529 | A | | 7/2009 |
| JP | 2009158529 | A | * | 7/2009 |
| JP | 2010-050127 | A | | 3/2010 |
| JP | 2010-165982 | A | | 7/2010 |

OTHER PUBLICATIONS

Jang, Jaehoon, et al., "Vertical Cell Array using TCAT (Terabit Cell Array Transistor) Technology for Ultra High Density NAND Flash Memory", 2009 Symposium on VLSI Technology Digest of Technical Papers (2009), pp. 192-193, Japan.

* cited by examiner (a)

(b)

NONVOLATILE MEMORY DEVICE AND METHOD FOR MANUFACTURING SAME

TECHNICAL FIELD

This invention relates to a nonvolatile memory device and a method for manufacturing the same, and more particularly to a technique effectively applied to an electrically rewritable nonvolatile memory and a manufacture thereof.

BACKGROUND ART

In recent years, a phase change memory using a chalcogenide material for a recording material has actively been researched. In a memory structure of the phase change memory, the recording material is interposed between metal electrodes. The phase change memory is a variable resistance memory that stores information by using a fact that the recording material between the electrodes has different resistive states.

PTL 1 (JP-A-2004-272975) discloses a memory using a variable resistance element in which a plurality of memory cells each having the variable resistance element changed in resistivity by voltage application is connected in series to form a memory cell series portion, and a select transistor is disposed on at least one end of the memory cell series portion.

Also, PTL 2 (JP-A-2005-260014) discloses the phase change memory in which memory blocks having the memory cells each including the memory element whose resistivity is changed according to a temperature are stacked together to realize an integration nonvolatile memory.

The phase change memory stores information with the use of a fact that a resistivity of the phase change material such as $Ge_2$, $Sb_2$, or $Te_5$ is different between an amorphous state and a crystal state. The phase change material is high in resistance in the amorphous state, and low in the resistance in the crystal state. Accordingly, read of information is conducted by giving a voltage difference to both ends of the phase change memory, measuring a current flowing in the element, and discriminating whether the element is in a high resistance state, or in a low resistance state.

In the phase change memory, an electric resistance of the phase change film is changed into a different state by a Joule heat generated by a current for programming. Reset operation, that is, the operation of changing the phase change material into the amorphous state of the high resistance is conducted by rapidly decreasing the current and rapidly cooling the phase change material after a large current has been allowed to flow in a short time to fuse the phase change material. On the other hand, set operation, that is, the operation of changing the phase change material into the crystal state of the low resistance is conducted by allowing a sufficient current to keep a crystallization temperature of the phase change material to flow for a long time. The phase change memory suits for miniaturization in principle because a current necessary to change the state of the phase change film becomes small as the miniaturization is advanced, and actively researched at present.

As a method of integrating the memory using those variable resistance element, PTL 3 (JP-A-2008-16004) discloses that a plurality of through-holes that penetrates through a stacked structure in which gate electrode material and insulator films are alternately stacked in plural number together is formed by simultaneous processing, and thereafter a gate insulator film, a channel layer, and a phase change film are formed on inner walls of the through-holes to form the plurality of memory cells.

Also, as disclosed in NPL 1, a memory manufacturing technique using a method of forming the plurality of through-holes that penetrates through the stacked structure in which the gate electrode material and the insulator films are alternately stacked in plural number together by simultaneous processing is published in the phase change memory as well as a flash memory.

CITATION LIST

Patent Literature

PTL 1: JP-A-2004-272975
PTL 2: JP-A-2005-260014
PTL 3: JP-A-2008-160004

Non-Patent Literature

NPL 1: "2009 Symposium on VLSI Technology", (Japan), 2009, p. 192 to 193

SUMMARY OF INVENTION

Technical Problem

In the memory cell disclosed in PTL 3, there is a need to form a low-resistive diffusion layer on an uppermost portion of channel silicon layers (channel semiconductor layers) formed from a bottom of a vertical transistor to an upper portion thereof to connect a metal wire and the memory cell formed on the memory cell.

However, the uppermost portion of the channel semiconductor layer is slightly abraded by a dry etching process and a cleaning process after the channel semiconductor layer has been formed. This leads to such a drawback that a thickness of the diffusion layer of the uppermost portion on the channel semiconductor layer is thinned, or the diffusion layer of the uppermost portion is eliminated. If the diffusion layer of the uppermost portion has been removed, a contact area of the diffusion layer or the channel silicon layer or the metal wire becomes extremely small, and a contact resistance between the metal cell and the metal wire becomes high. For that reason, when the memory cell disclosed in PTL 3 is formed, it is difficult to lessen a contact resistance between a metal film configuring an upper electrode line formed after the phase change material film has been formed, and the channel silicon layer to form an electric connection with a high reliability. If the contact resistance between the diffusion layer and the metal wire is high, no sufficient current flows in the vertical transistor disclosed in PTL 3, and program and read of the phase change memory cannot normally be conducted.

As with the flash memory disclosed in NPL 1, a plug that contacts with the upper diffusion layer is formed from a silicon film after the formation of the memory cell, an excellent contact can be formed between the upper diffusion layer and the plug. However, in the case of not the flash memory but the phase change memory, there is a possibility that the phase change material does not withstand a thermal load in a forming process of the silicon film configuring the plug and a silicon crystallization process, and is fused or volatilized. Therefore, this method cannot be used. Also, even in the flash memory, a dedicated mask is required to form a silicon plug, resulting in such a problem that the manufacture costs are increased.

An object of this invention is to reduce the contact resistance between the upper diffusion layer on top of the vertical transistor configuring the nonvolatile storage device, and the metal wire.

The above object and novel features of this invention will become apparent from the description of the present specification and the attached drawings.

Solution to Problem

An outline of typical features in the invention disclosed in the present application will be described in brief as follows.

According to this invention, there is provided a nonvolatile storage device, including:

a first conductive layer formed on a semiconductor substrate, and extended in a first direction along a main surface of the semiconductor substrate;

a select element formed on the first conductive layer, and electrically connected to the first conductive layer;

a stacked film including a plurality of first insulator films and a plurality of second conductive layers alternately stacked on the select element;

a first semiconductor layer and a memory material layer which are formed on a sidewall of the stacked film through a second insulator film, and electrically connected to the select element;

a third conductive layer formed on the stacked film, and electrically connected to the first semiconductor layer; and a fourth conductive layer formed on the third conductive layer, electrically connected to the third conductive layer, and extended in a second direction orthogonal to the first direction.

Also, according to this invention, there is provided a method for manufacturing a nonvolatile storage device, including the steps of:

(a) forming, on a semiconductor substrate, a first conductive layer extended in a first direction along a main surface of the semiconductor substrate;

(b) forming, on the first conductive layer, a stacked film in which (N+1) (N is an integer of N≥1) first insulator films and N second conductive layers are alternately stacked together;

(c) forming a third conductive layer on the stacked film;

(d) forming a second insulator film on a side wall of the stacked film, and forming a first semiconductor layer and a memory material layer, which are electrically connected to the third conductive layer, on a sidewall of the second insulator film which comes out of contact with the stacked film; and (e) after the step (d), forming, on the third conductive layer, a fourth conductive layer electrically connected to the third conductive layer, and extended in a second direction orthogonal to the first direction.

Advantageous Effects

Advantageous effects obtained by the typical features of the invention disclosed in the present application will be described in brief below.

According to this invention, the contact resistance between the upper diffusion layer on top of the vertical transistor configuring the nonvolatile storage device, and the metal wire can be reduced.

DESCRIPTION OF EMBODIMENTS

Figure 1:
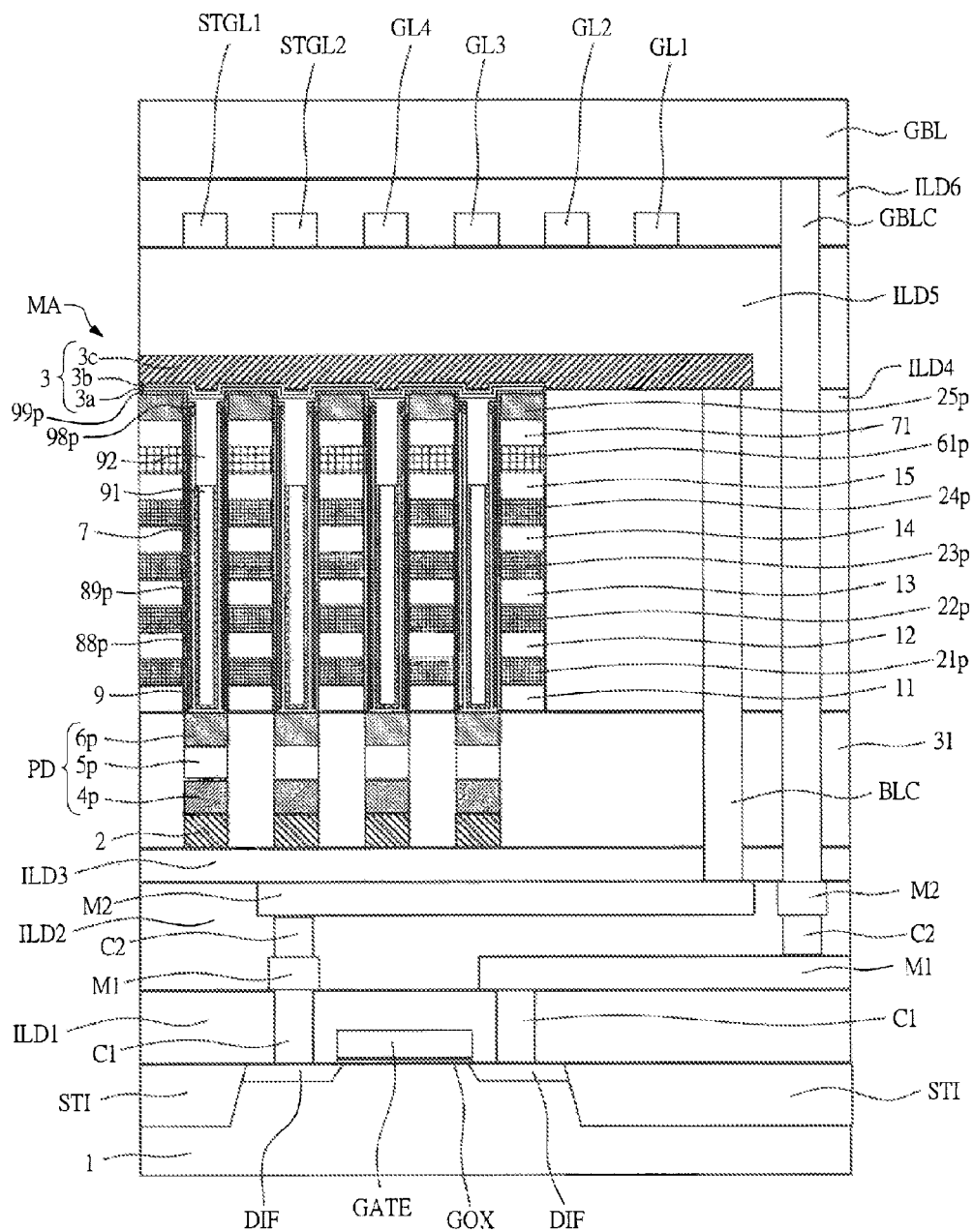
FIG. 1 is a cross-sectional view of a vertical chain memory according to a first embodiment of this invention.

Hereinafter, embodiments of this invention will be described in detail with reference to the drawings. In all of the drawings for describing the embodiments, members having the same function are denoted by identical symbols, and the repetitive description will be omitted. Also, in the following embodiments, the description of the identical or similar parts is not repeated in principle unless necessary.

Also, in the drawings used in the following embodiments, hatching may be partially omitted even in cross-sectional views for facilitating visualization of the drawings.

Also, in the drawings used in the following embodiments, hatching may be partially omitted even in plan views and bird's eye views for facilitating visualization of the drawings.

First Embodiment

A part of a cross-sectional view of a vertical chain memory according to this embodiment is illustrated in FIG. 1. FIG. 1 is a cross-sectional view of a nonvolatile storage device according to this embodiment, which partially illustrates a memory cell array, lines, and a contact plug. A gate electrode GATE is formed on a semiconductor substrate 1 through a gate insulator film GOX, and diffusion layers DIF are formed on a main surface of the semiconductor substrate 1 so as to sandwich the semiconductor substrate 1 at the bottom of the gate electrode GATE therebetween. The diffusion layers DIF and the gate electrode GATE configure a field effect transistor that selects a word line 2 or a bit line 3. Isolation layers STI are formed on an upper surface of the semiconductor substrate 1 in contact with the respective diffusion layers DIF. An interpoly dielectric film ILD1 is formed on the semiconductor substrate 1 so as to cover the gate electrode GATE and the isolation layers STI. Interpoly dielectric films ILD2, ILD3, an insulator film 31, interpoly dielectric films ILD4, ILD5, ILD6, and a global bit line GBL are formed on the interpoly dielectric film ILD1 in order from the semiconductor substrate 1 side.

Line layers M1 and M2 are formed in a lower portion and an upper portion within the interpoly dielectric film ILD2, respectively, and the line layer M2 is electrically connected to the diffusion layers DIF through a contact plug C2 formed between the line layer M2 and the line layer M1, and a contact plug C1 that penetrates through the line layer M1 and the interpoly dielectric film ILD1.

A plurality of word lines 2 which is line patterns formed of metal films and formed into stripes extending in a first direction (vertical direction to a paper plane of FIG. 1) along the main surface of the semiconductor substrate 1 is formed on the interpoly dielectric film ILD3. A plurality of columnar polysilicon diodes PD is formed on the word lines 2 at given intervals in the first direction. The plurality of word lines 2 is formed to be aligned in a second direction which is orthogonal to the first direction and along the main surface of the semiconductor substrate 1. The plurality of columnar polysilicon diodes PD is arranged on the respective word lines 2. Therefore, the plurality of word lines 2 is formed in a matrix two-dimensionally. Also, insulator films 31 are embedded between the respective columnar polysilicon diodes PD.

In the present specification, the stripe patterns represent patterns extending in one direction along the main surface of the semiconductor substrate, which are aligned at given intervals in the other direction orthogonal to their extending direction, and along the main surface of the semiconductor substrate.

The plurality of columnar polysilicon diodes PD includes polysilicon layers 4$p$, 5$p$, and 6$p$ formed on the respective word lines 2 in order, and has columnar shapes extending in a direction perpendicular to the main surface of the semiconductor substrate 1. The polysilicon layer 4$p$ is a semiconductor layer doped with p-type impurities (for example, B (boron)), and the polysilicon layer 6$p$ is a semiconductor layer doped with n-type impurities (for example, As (arsenic)). The polysilicon layer 5$p$ is an intrinsic semiconductor layer, however, in fact, impurities are produced into the polysilicon layer 5$p$ with a lower concentration than that of the polysilicon layers 4$p$ and 6$p$. That is, each of the columnar polysilicon diodes PD is a PIN diode in which the intrinsic semiconductor layer is arranged between the p-type semiconductor layer and the n-type semiconductor layer.

The patterns in which the insulator films and the conductive layers are alternately stacked together in plural number in order from below, which are formed into the stripe shape in the first direction, are arranged on the columnar polysilicon diodes PD and the insulator films 31. That is, on the columnar polysilicon diodes PD are formed an insulator film 11, a polysilicon layer 21$p$, an insulator film 12, a polysilicon layer 22$p$, an insulator film 13, a polysilicon layer 23$p$, an insulator film 14, a polysilicon layer 24$p$, an insulator film 15, a polysilicon layer 61$p$, an insulator film 71, and a polysilicon layer 25$p$, in the order from the side of the semiconductor substrate 1. That is, the polysilicon layer 25$p$ which is a conductive layer is formed on a stacked film having an (N+1) (N is an integer of N≥1) and N conductive layers alternately stacked together.

The polysilicon layers 21$p$ to 24$p$ are conductive layers that function as the gates of cell transistors (select transistors) each selecting a plurality of memory cells connected in series in a direction perpendicular to the main surface of the silicon substrate. The polysilicon layers 21$p$ to 24$p$ are formed into the stripe shape each extending in the first direction.

Also, the polysilicon layer 61$p$ which is a gate line, functions as a gate for selecting two lines of vertical chain memories formed on facing inner walls within the grooves between the adjacent stacked films including the polysilicon layers 21$p$ to 24$p$ in the second direction. The stacked film including the polysilicon layers 21$p$ to 24$p$, and 61$p$ which are gate line are formed immediately above the insulator films 31, and not formed immediately above the columnar polysilicon diode PD.

An insulator film 9, polysilicon layers 88$p$, 89$p$, a phase change material film 7, and an insulator film 91 are formed on each sidewall of the stacked film in order from the sidewall side of the stacked film. The polysilicon layer 89$p$ and the phase change material layer 7 are also formed on the bottom of each groove, and therefore are U-shaped in a cross-section along the second direction as illustrated in FIG. 1. Heights of upper surfaces of the phase change material film 7 and the insulator film 91 are substantially identical with each other, and are located in a region higher than an upper surface of the polysilicon layer 24$p$, and lower than a lower surface of the polysilicon layer 61*p*. A region lower than the height of an uppermost surface of the phase change material film 7 within the groove is embedded with the insulator film 9, the polysilicon layers 88*p*, 89*p*, the phase change material film 7, and the insulator film 91. However, a region higher than the uppermost surface of the phase change material film 7 within the groove is embedded with not the phase change material film 7 and the insulator film 91, but an insulator film 92. That is, the insulator film 9, the polysilicon layers 88*p*, 89*p*, and the insulator film 92 are formed in order on each sidewall of the insulator film 15, the polysilicon layer 61*p*, and the insulator film 71 which configure the stacked film, and the polysilicon layer 25*p*. That is, the insulator film 92 is formed over the phase change material film 7 and the insulator film 91.

Each of the polysilicon layers 21*p* to 24*p*, and the polysilicon layers 88*p*, 89*p*, and the phase change material film 7 formed on the side wall of those polysilicon layers through the insulator film 9 configure a memory cell of the phase change memory. Each of the polysilicon layers 21*p* to 24*p*, and the polysilicon layers 88*p* and 89*p* formed on the side wall of those polysilicon layers through the insulator film 9 configure a cell transistor for selecting any memory cell.

The insulator film 9 is a gate insulator film of the select transistor such as the cell transistor for selecting the memory cell, and the polysilicon layers 88*p* and 89*p* are channel layers forming conductive paths of their transistors. Also, the polysilicon layer 25*p* is a semiconductor layer higher in impurity concentration than the polysilicon layers 88*p* and 89*p*. Impurities of the same conductivity type as that of the polysilicon layers 88*p* and 89*p* are introduced into the polysilicon layer 25*p* with a relatively high concentration.

A polysilicon layer 99*p* which is a semiconductor layer having an impurity concentration higher than that of the polysilicon layer 88*p* is formed on the insulator film 9 functioning as the gate insulator film and the polysilicon layer 89*p*. A polysilicon layer 98*p* which is a semiconductor layer having an impurity concentration higher than that of the polysilicon layer 88*p* is formed on the polysilicon layer 88*p*. The impurities of the same conductivity type as that of the polysilicon layers 88*p* and 89*p* are introduced into the polysilicon layers 98*p* and 99*p* with a relatively high concentration. The polysilicon layer 99*p* is formed on an upper surface and a sidewall of the polysilicon layer 25*p*, and formed to cover an upper surface and a sidewall of the polysilicon layer 89*p* in a cross-section along the second direction.

Metal films 3*a*, 3*b*, and 3*c* are formed on the insulator film 92 and the polysilicon layer 99*p* in order from the main surface side of the semiconductor substrate 1. The metal films 3*a*, 3*b*, and 3*c* configure the bit line 3, and are shaped into stripes extending in the second direction. The bit line 3 is a metal wire for selecting the phase change memory, and is formed on the interpoly dielectric film ILD4. The word lines 2 and the bit lines 3 are electrically connected to each other through the polysilicon diode, the polysilicon layers 88*p* and 89*p*, the phase change material film 7, and the polysilicon layers 98*p* and 99*p* formed therebetween. The bit line 3 and the diffusion layers DIF are electrically connected to each other through the contact plug BLC, the line layers M2 and M1, and the contact plugs C1 and C2. The bit line 3 is connected to other circuits. The polysilicon layers 25*p*, 98*p*, and 99*p* are diffusion layers of the vertical transistors with the polysilicon layers 88*p* and 89*p* as channel layers, and provided for electrically connecting the vertical chain memory and the bit line 3.

On the interpoly dielectric film ILD5, lines STGL1, STGL2, GL1, GL2, GL3, and GL4 for feeding electricity to the gates are aligned in stripes in the first direction. The global bit line GBL which is a line formed on the interpoly dielectric film ILD6 and the line layer M1 are electrically connected to each other through a contact plug GBLC that penetrates through the interpoly dielectric films ILD3 to ILD6, the line layer M2, and the contact plug C2.

In the present specification, a region including the plurality of polysilicon diodes PD, the polysilicon layers 21*p* to 24*p*, and 61*p*, the phase change material layer 7, the polysilicon layers 88*p*,89*p*, 98*p*, and 99*p*, the polysilicon layer 25*p*, the insulator film 9, the bit line 3, and the word electrode 2 is called "memory cell array MA".

In a region not shown, the polysilicon layers 21*p* to 24*p* are electrically connected to the lines GL1 to GL4 through the contact plug, respectively. Also, the polysilicon layers 61*p* is connected to the line STGL1 or the line STGL2.

The adjacent polysilicon layers 61*p* formed in the second direction are electrically isolated from each other. One of the two adjacent polysilicon layers 61*p* is connected to the line STGL1, and the other polysilicon layer is connected to the line STGL2. Therefore, voltages independent from each other can be applied to the adjacent polysilicon layers 61*p*. In the regions not shown in FIG. 1, in the polysilicon layer 61, the stripe patterns alternately arranged are integrally joined together on one ends of the respective patterns in the extending direction. Also, the plurality of polysilicon layers 61*p* isolated from the above strip patterns and arranged between the above adjacent stripe patterns are joined together in a region in which the memory cell array is interposed therebetween opposite to the region in which the above stripe patterns are joined together.

That is, for example, the adjacent polysilicon layers 21*p* are not electrically connected to each other, but two other polysilicon layers 61*p* between which one polysilicon layer 61*p* is interposed are electrically connected to each other. One polysilicon layer 61*p* arranged between the two polysilicon layers 61*p* electrically connected to each other, and isolated from those two polysilicon layers 61*p* is electrically connected to the polysilicon layers 61*p* arranged at opposite sides of those adjacent polysilicon layers 61*p*.

The polysilicon layers 21*p* to 24*p* have a planar shape similar to that of the polysilicon layer 61*p*. The respective adjacent patterns are connected to the lines of the upper portions through the contact plug at an opposite side of the memory cell array. However, because there is no need to control the voltages of the adjacent polysilicon layers, separately, unlike the polysilicon layer 61*p*, the adjacent patterns are connected to the same lines.

That is, for example, the polysilicon layers 21*p* that function as the gate lines or the gate electrodes of the memory cells are all connected to the same line GL1 and short-circuited to each other regardless of the adjacent strip patterns being odd-numbered or even-numbered starting from one end thereof in the second direction. Accordingly, when a given potential is applied to the line GL1, all of the polysilicon layers 21*p* which are the gate electrodes have the same voltage. That is, all of the cells on the same plane as that of the polysilicon layer 21*p* can be selected or unselected by the line GL1 simultaneously. The same is applied to the polysilicon layers 22*p*, 23*p*, and 24*p*. With the above connection relationship, the select cell or unselected call in a z-axial direction (height direction) can be determined in the memory cell array MA which will be described later.

On the contrary, the polysilicon layer 61*p* that functions as the gate line or the gate electrode of the select transistor for selecting any memory cell of the two lines of memory cells formed on the same polysilicon diode PD and electrically connected in parallel to the polysilicon diode PD is not connected to the same line between the odd-numbered and even-number stripe patterns starting from one end thereof in the second direction. That is, the stripe patterns are alternately connected to the two lines STGL1 and STGL2 isolated from each other, and the voltages can be applied to the stripe patterns, independently. With the above connection relationship, in the cells having the same height in the z-axial direction which are selected simultaneously by any one of the above-mentioned lines GL1 to GL4, the odd-numbered cell or the even-numbered cell starting from one end in the second direction can be specified.

Since all of the polysilicon layers 21p are resultantly short-circuited, there is proposed a method in which not the odd-numbered stripe patterns and even-numbered stripe patterns are short-circuited, separately, and then short-circuited through the contact plug and the line GL1, but short-circuited polysilicon layer is formed regardless of the odd-numbered stripe patterns or the even-numbered stripe patterns. However, as described above, the odd-numbered stripe patterns and the even-numbered stripe patterns are integrated together in different regions in the same layer, and those regions are short-circuited through the contact plugs and the gate lines. As a result, in the process of manufacturing the vertical chain memory, the polysilicon layers 21p to 24p and 61p can have the same shape. For that reason, those polysilicon layers can be all produced with an identical mask, and the manufacture costs can be remarkably reduced.

Also, in a region not shown, a contact plug that connects the word lines 2 and field effect transistors formed on the semiconductor substrate 1 is formed at the bottom of the word lines 2. The lines STGL1, STGL2, GL1, GL2, GL3, and GL4 are electrically connected to the peripheral circuits formed on the semiconductor substrate 1 through the contact plugs, respectively.

Figure 2:
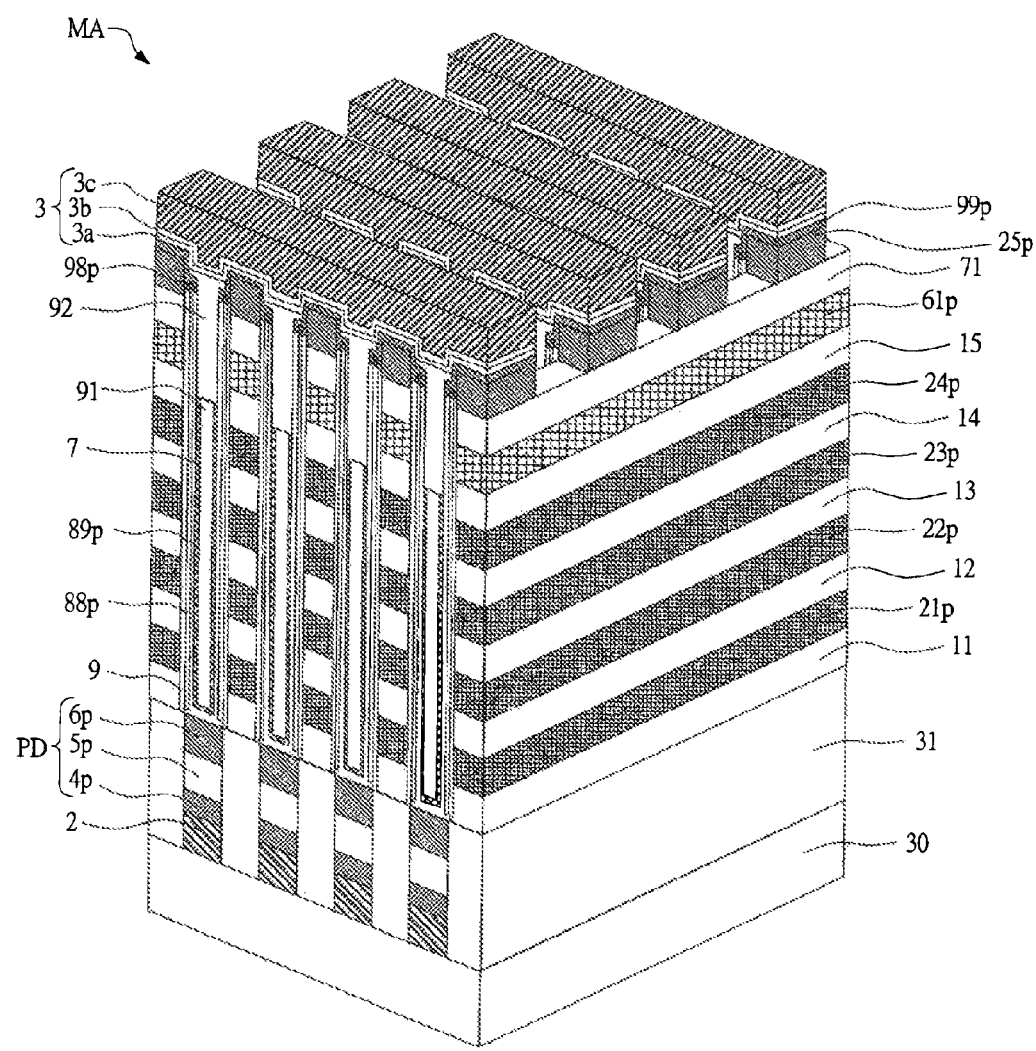
FIG. 2 is a bird' eye view of the vertical chain memory according to the first embodiment of this invention.

FIG. 2 is a bird' eye view of the vertical chain memory according to this embodiment. FIG. 2 is a bird' eye view illustrating, particularly, an extracted portion of the memory cell array MA in FIG. 1. The plurality of polysilicon diodes PD is periodically formed in the first direction on the respective word lines 2 extending in the first direction. The sidewalls of the respective polysilicon diodes PD are covered with the insulator films 31 embedded between the respective adjacent polysilicon diodes PD in the second direction. Therefore, in the figure, only a part of the plural polysilicon diodes PD aligned in the first direction is illustrated.

As illustrated in FIG. 2, the stacked film including the polysilicon layers 21p, 22p, 23p, 24p, and 61p, and the insulator films 11, 12, 13, 14, 15, and 71 is patterned into stripes extending in the extending direction (first direction) of the word lines 2. The pattern includes line portions in which the stacked film including the polysilicon layers 21p, 22p, 23p, 24p, and 61p, and the insulator films 11, 12, 13, 14, 15, and 71 remains during the process, and space portions in which the stacked film including the polysilicon layers 21p, 22p, 23p, 24p, and 61p, and the insulator films 11, 12, 13, 14, 15, and 71 is removed during the process.

The stacked film (line portion) is formed immediately above the spaces between the respective word lines 2, and the space portions between the adjacent stacked films are arranged immediately above the word lines 2, The bit lines 3 have a stripe shape extending in a direction (second direction) orthogonal to the extending direction of the word lines 2, and are arranged on the insulator film 71 through the n-type polysilicon layers 25p and 99p. As will be described later, it is conceivable that the polysilicon layer 99p on the polysilicon layer 25p is removed through the manufacturing process, and the polysilicon layer 25p comes in direct contact with the metal film 3a on the polysilicon layer 99p.

The insulator film 9 which is the gate insulator film, the polysilicon layers 88p and 89p which are the channel semiconductor layers, an insulator film (not shown) which is a diffusion prevention film, and the phase change material film 7 which is a memory element are stacked in order on each sidewall of the polysilicon layers 21p, 22p, 23p, and 24p, and the insulator films 11, 12, 13, and 14, and each sidewall of a lower portion of the insulator film 15 in the space portions between the respective stacked films and immediately before the bit lines 3. The insulator film which is the diffusion prevention film is a film for preventing impurities from diffusing between the phase change material film 7 and the polysilicon layer 89p. The insulator film 91 is embedded between the respective phase change material films 7 formed on the respective facing sidewalls of the adjacent stacked films, and the polysilicon diode PD is arranged immediately below the insulator film 91.

The insulator film 9, and the polysilicon layers 88p and 89p are stacked in order on each sidewall of an upper portion of the insulator film 15, and each sidewall of the polysilicon layer 61p and the insulator film 71. The insulator film 92 is embedded between the polysilicon layers 89p formed on the respective facing sidewalls of the space portion in the second direction. An upper surface of the polysilicon layer 6p and a lower surface of the polysilicon layer 89p come in contact with each other in each space portion of the stacked film and on the bottom immediately below the bit line 3. The bit lines 3 and the word lines 2 are electrically connected to each other through the polysilicon layers 99p and 25p, the polysilicon layers 88p and 89p, and the polysilicon diodes PD. That is, the bit lines 3 and the word lines 2 are joined together through the conductive paths along the sidewalls of the stacked films.

The polysilicon layers 88p, 89p, 98p, and 99p, the phase change material film 7, and the insulator film which is the diffusion prevention film are removed in the space portions of the stacked films and immediately below the space portions between the adjacent bit lines 3 in the first direction. Also, the polysilicon diode PD on the word line 2 is not formed in the above region, and the space portion between the adjacent polysilicon diodes PD in the first direction is formed. Although not illustrated in FIG. 2, an insulator film 32 is embedded in that space portion.

The nonvolatile storage device according to this invention stores information with the use of a fact that a resistivity of the phase change material such as $Ge_2$, $Sb_2$, or $Te_5$ included in the phase change material film 7 is different between an amorphous state and a crystal state. The phase change material is high in resistance in the amorphous state, and low in the resistance in the crystal state.

When the phase change material is subjected to phase change, the phase change material film 7 of the amorphous state is heated to a crystallization temperature or higher, and maintained at that temperature for about $10^{-6}$ seconds or longer, to thereby obtain the crystal state. Also, the phase change material film 7 of the crystal state is heated to a temperature of a melting point or higher into a liquid state, and thereafter rapidly cooled to obtain the amorphous state. Read of stored information from the phase change material film 7 which is the memory element is conducted by giving a voltage difference to both ends of the variable resistance memory, measuring a current flowing in the element, and discriminating whether the element is in a high resistance state, or in a low resistance state.

Figure 3:
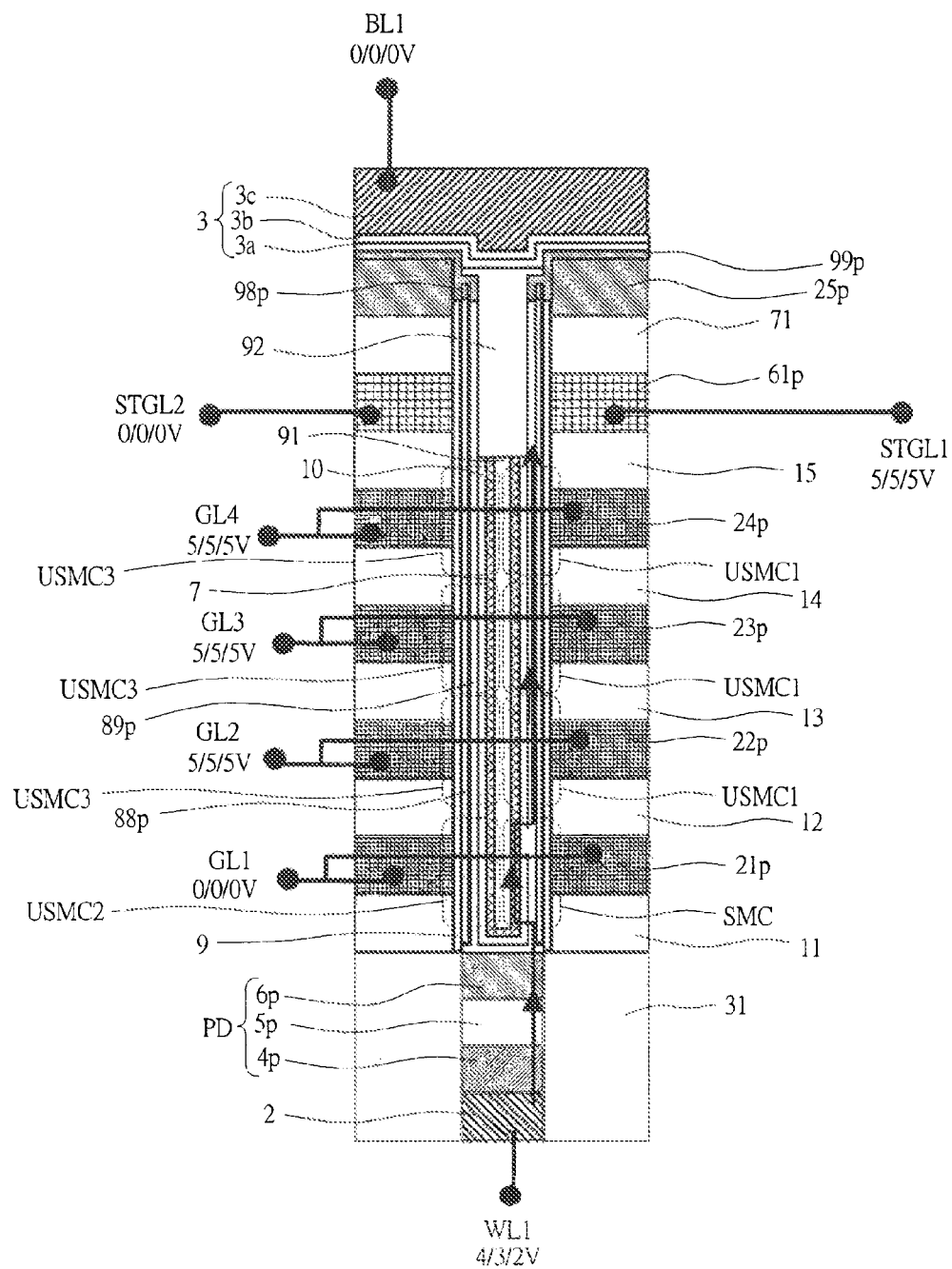
FIG. 3 is a cross-sectional view illustrating the operation of the vertical chain memory according to the first embodiment of this invention.
Figure 4:
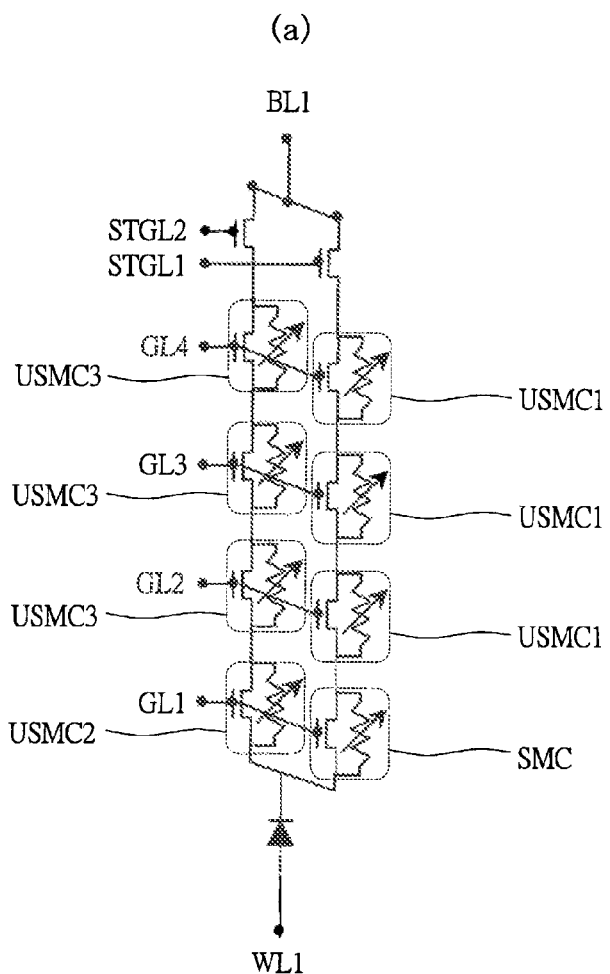
FIG. 4(a) is an equivalent circuit diagram illustrating the operation of the vertical chain memory illustrated in FIG. 3.
FIG. 4(b) is a broken top view illustrating the vertical chain memory illustrated in FIG. 4.
Figure 4:
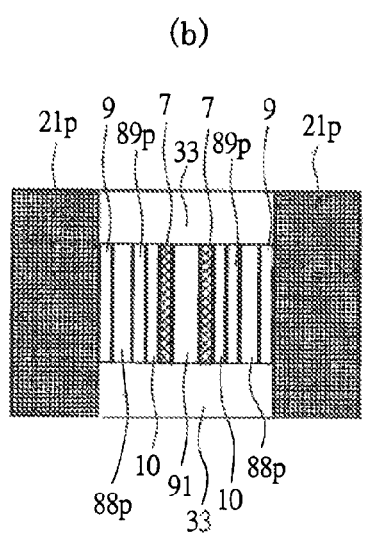

FIG. 3 illustrates a part of the memory cell array MA according to this embodiment. Also, FIG. 4(a) illustrates an equivalent circuit diagram of the memory cell illustrated in FIG. 3, and FIG. 4(b) is a top view illustrating the memory cell illustrated in FIG. 3, taken along a surface including the polysilicon layer 21p. A structure illustrated in FIG. 3 represents one of the plurality of memory cells formed in a matrix within the memory cell array MA (refer to FIG. 1). The plurality of memory cells includes the cell select transistor having the polysilicon layer configuring the stacked film, and the channel semiconductor layer formed on the side walls of the stacked film, and the variable resistance material layer which is the memory element adjacent to the channel semiconductor layer.

As illustrated in FIG. 3, in the plurality of memory cells each having the transistor and the phase change element connected in parallel which are connected in series with each other in a vertical direction, that is, the vertical chain memory, for example, the following operation is conducted. In the following description, when "0V" is merely said, it is meant that 0 V is applied in any cases of reset operation, set operation, and read operation. Also, when a number below reference symbol illustrated in FIG. 3, for example, "5/5/5V", voltages to be applied in the respective operation of the reset (erase) operation, the set (program) operation, and read operation of the memory cell starting from the left are indicated with separators of "/".

0V is applied to the line GL1 which is the gate line connected with a select cell SMC illustrated in FIGS. 3 and 4(a) to turn off the transistor with the polysilicon layers 88p and 89p illustrated in FIG. 3 as a channel. 5V is applied to the lines GL2, GL3, and GL4 which are the gate lines which are not connected with the select cell SMC to turn on the transistor. In the reset operation, the set operation, and the read operation, 4V, 3V, and 2V are applied to the word line 2, respectively, and 0V are applied to the bit line BL1.

Also, 5V is applied to the gate of the select transistor on a side connected with the select cell SMC, that is, the polysilicon layer 61p to turn on the transistor. 0V is applied to the gate of the select transistor on a side not connected with the select cell SMC, that is, the polysilicon layer 61p connected to the line STGL2 to turn off the transistor. In this situation, in the selected cell SMC, the transistor is off, and therefore a current flows in the phase change material film 7. A path in which the current flows in this situation is indicated by arrows in FIG. 3.

In the resent operation and the set operation, a resistivity of the phase change material layer 7 is changed according to the current flowing in the phase change material layer 7 of the select cell SMC. In the read operation, a current value flowing in the phase change material layer 7 of the select cell SMC is determined to conduct the operation. The transistors of an unselected cell USMC2 and an unselected cell USMC3 share respective common gate voltages with the transistors of the select cell SMC and the unselected cell USMC1. Therefore, in the reset operation, the set operation, and the read operation of the select cell SMC, the transistor of the unselected cell USMC2 is off, and the transistor of the unselected cell USMC3 is on. Since the select transistor including the polysilicon layer 61p connected with the line STGL2 is off, no current flows through the unselected cell USMC2 and the unselected cell USMC3. Accordingly, the current flowing in the phase change material layer 7 flows in only the phase change material layer 7 of the select cell SMC to enable selective operation.

FIG. 4(b) illustrates a cross-sectional view of the memory cell of the vertical chain memory taken along a surface along the main surface of the semiconductor substrate for illustrating the configuration (plane configuration) viewed from an upper surface of the phase change element. As illustrated in FIG. 4(b), there are a region in which the insulator film 9, the polysilicon layers 88p and 89p, an insulator film 10 which is the diffusion prevention film, the phase change material layer 7, and the insulator film 91 are formed in order from the sidewall of one polysilicon layer 21p, and regions in which only each insulator film 33 is formed, between the respective polysilicon layers 21p extending in the first direction. In the figures other than FIGS. 3 and 4(b) of the present application, the insulator film 10 interposed between the polysilicon layer 89p and the phase change material film 7 is omitted for facilitation to understand the figures.

Although not shown, a description will be given of a relationship of the voltages among the bit lines BL1, BL2, BL3, and BL4, the word lines WL1, WL2, and WL3, the lines GL1, GL2, GL3 and GL4 which are the gate lines, and the lines STGL1 and STGL2 which are the gate lines, when conducting the reset operation, the set operation, and the read operation of the vertical chain memories arranged in a matrix. Although not shown, the bit lines BL2, BL3, and BL4, and the word lines WL2 and WL3 are lines aligned with the bit BL1 and the word line WL1, respectively.

Like FIG. 3, 4/3/2V are applied to the word line WL1 in the reset operation, the set operation, and the read operation, respectively. In the vertical chain memory connected to the bit line BL2, bBL3, or BL4, and connected to the word line WL1, the voltages of the bit line and the word line are both 4V in the reset operation, both 3V in the set operation, both 2V in the read operation. Thus, since there is no voltage difference, no current flows therein. Also, in the vertical chain memory connected to the bit line BL1, and the word line WL2 or WL3, the voltages of the bit line and the word line are both 0V in the reset operation, the set operation, and the read operation. Thus, since there is no voltage difference, no current flows therein.

Also, in the vertical chain memory connected to the bit line BL2, bBL3, or BL4, and connected to the word line WL2 or WL3, 0V and 4V are applied to the word line and the bit line in the reset operation, respectively, 0V and 3V are applied to the word line and the bit line in the set operation, respectively, and 0V and 2V are applied to the word line and the bit line in the read operation, respectively. In this case, because a voltage is applied in a reverse bias direction of the polysilicon diodes PD for selecting the vertical chain memory, no currents flow in the vertical chain memory. An off current in the reverse bias direction of the polysilicon diodes PD can be sufficiently reduced.

Accordingly, in only the vertical chain memory connected to the bit line BL1 and the word line WL1, a forward bias is applied to the polysilicon diodes PD, and a current can flow therein. Since the select cell SMC within a specific vertical chain memory can be selected and operated by the method described in FIG. 3, a specific select cell SMC within the memory cell array including the vertical chain memories arranged in a matrix can be selected and operated.

Subsequently, the advantages of the nonvolatile storage device according to this embodiment will be described. The significant feature of the vertical chain memory according to this embodiment resides in that the polysilicon layer 25p which is a conductive layer higher in impurity concentration than the polysilicon layers 88p and 89p is formed on the stacked film including the polysilicon layers 21p, 22p, 23p, 24p, and 61p, and the insulator films 11, 12, 13, 14, 15, and 71, as illustrated in FIG. 3.

When no polysilicon layer 25p is formed, it is conceivable that the polysilicon layer 99p is formed directly on the insulator film 71 on the uppermost portion of the stacked film formed into the stripe shape, and the bit line 3 and the polysilicon layers 88*p* and 89*p* which are the channel layers are electrically connected to each other through the polysilicon layer 99*p* on the insulator film 71. In this case, if the polysilicon layer 99*p* having the same thickness as that of the polysilicon layer 89*p* on the side wall of the stacked film is formed on the overall upper surface of the insulator film 71, because a sufficient contact area is obtained between the bit line 3 and the polysilicon layer 99*p*, an excellent connection can be obtained.

Figure 28:
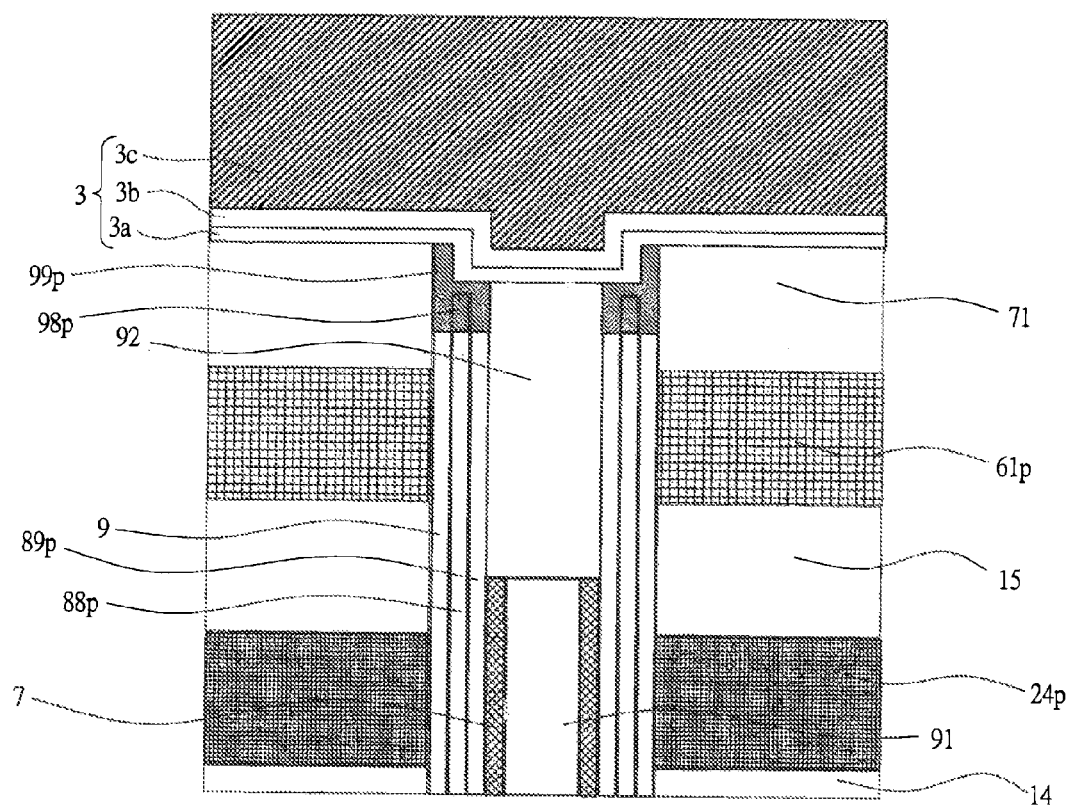
FIG. 28 is a cross-sectional view illustrating a vertical chain memory in a comparative example.

However, in recent years, a reduction in the size of the nonvolatile storage device is advanced, and a reduction in the thickness of the polysilicon layers 88*p* and 89*p* which are the channel layers of the vertical chain memory is also required. For that reason, the thickness of the polysilicon layer 99*p* formed by introducing impurities into the polysilicon layer 89*p* is very thin. In this case, as illustrated in FIG. 28, the polysilicon layer 99*p* very thinly formed on the insulator film 71 is removed through an etching process or a cleaning process after the polysilicon layer 99*p* has been formed. The bit lines 3 are formed in contact with the polysilicon layer 99*p* that remains on the upper surface of the insulator film 71 and the sidewalls of the insulator film 71. FIG. 28 is a cross-sectional view illustrating a vertical chain memory in a comparative example.

In this case, the contact area of the polysilicon layer 99*p* remaining on the sidewalls of the insulator film 71 and the bit lines 3 becomes extremely small as compared with a case in which the polysilicon layer 99*p* is formed on the overall upper surface of the insulator film 71. For that reason, the contact resistance between the bit lines 3 and the polysilicon layer 99*p* becomes high, resulting in a risk that a power consumption of the vertical chain memory becomes high. Also, for the same reason, there is a risk that the vertical chain memory does not normally operate. Also, because a contact failure between the bit lines 3 and the polysilicon layer 99*p* is liable to occur, there is a risk that the vertical chain memory does not normally operate.

Accordingly, in order to form an excellent contact between the bit lines 3 and the polysilicon layer 99*p* to improve the reliability of the nonvolatile storage device, it is important to provide on the insulator film 71*a* conductive layer for excellently connecting the polysilicon layer 99*p* and the bit lines 3, which is electrically connected to the polysilicon layer 99*p* and the bit lines 3.

Under the circumstances, in the vertical chain memory according to this embodiment, the polysilicon layer 25*p* which is a conductive layer higher in the impurity concentration than the polysilicon layers 88*p* and 89*p*, and low in the resistance is formed on the stacked film including the polysilicon layers 21*p*, 22*p*, 23*p*, 24*p*, and 61*p*, and the insulator films 11, 12, 13, 14, 15, and 71. With this configuration, even if the polysilicon layer 99*p* immediately above the stacked film has been removed, an electric connection between the polysilicon layer 99*p* and the bit lines 3 can be excellently formed between the bit lines 3 and the polysilicon layer 99*p* through the polysilicon layer 25*p* having a sufficient connection area. Accordingly, the reliability of the nonvolatile storage device can be improved.

Figure 5:
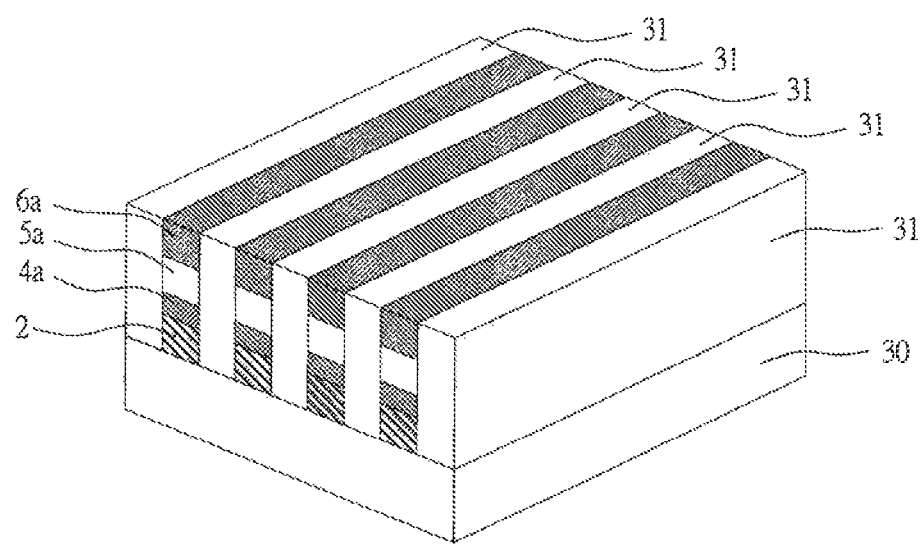
FIG. 5 is a bird's eye view illustrating a method for manufacturing the vertical chain memory according to the first embodiment of this invention.
Figure 6:
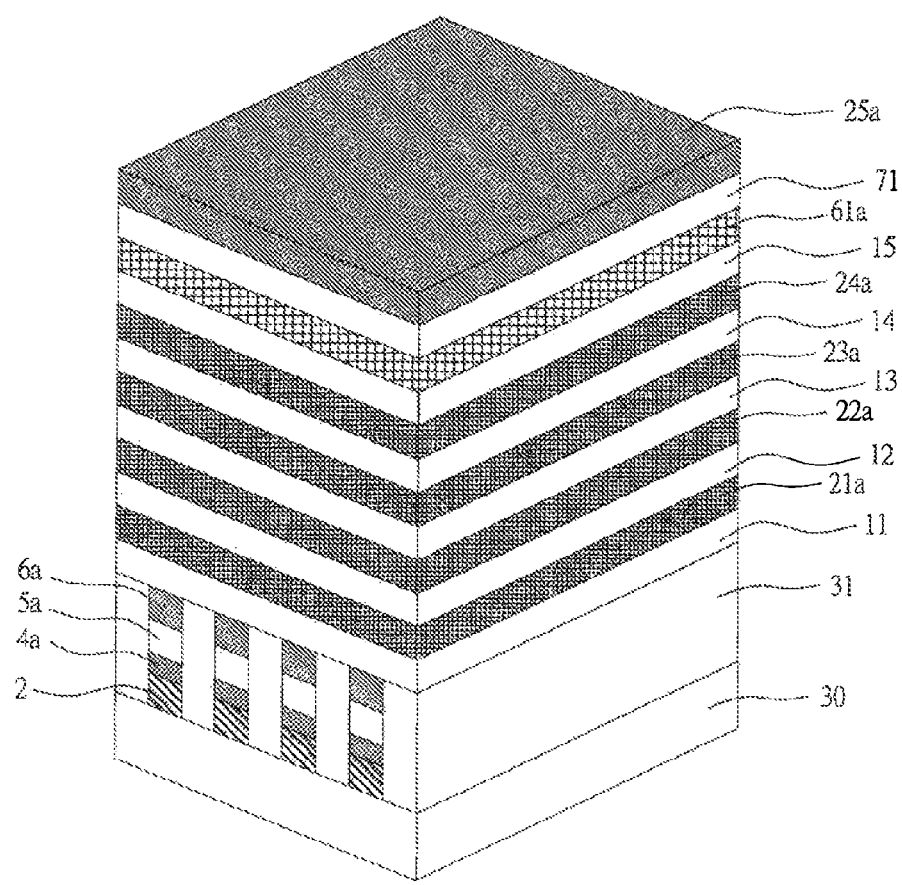
FIG. 6 is a bird's eye view illustrating the method for manufacturing the vertical chain memory subsequent to FIG. 5.

Subsequently, a description will be given of a method for manufacturing the nonvolatile storage device according to this embodiment with reference to FIGS. 5 to 18. FIGS. 5 and 6 are bird's eye views illustrating the vertical chain memory during a manufacturing process according to the first embodiment of this invention. FIGS. 7 to 18 are cross-sectional views illustrating the vertical chain memory during the manufacturing process.

As illustrated in FIG. 5, an interpoly dielectric film 30, a tungsten film that forms the word lines, an amorphous silicon layer 4*a* doped with p-type impurities (for example, boron (B)), an amorphous silicon layer 5*a* doped with impurities of the low concentration, and an amorphous silicon layer 6*a* doped with n-type impurities (for example, P (phosphorous)) are formed in turn on the semiconductor substrate 1 (not shown) in which the contact plugs for connecting the peripheral circuits and the word lines are formed. Then, the films formed on the interpoly dielectric film 30 are processed into a stripe pattern extending in the first direction along the main surface of the semiconductor substrate 1 to form the word lines 2 formed of the tungsten film. Since the amorphous silicon layers 4*a*, 5*a*, and 6*a*, and the word lines 2 are processed simultaneously in a self-alignment manner, no stack displacement occurs in the respective layers of the word lines 2, and the amorphous silicon layer 4*a*, 5*a*, and 6*a* in the first direction, and the reliability of the memory program operation can be enhanced.

Thereafter, the spaces between the respective patterns including the word lines 2, and the amorphous silicon layers 4*a*, 5*a*, and 6*a*, which are processed into the stripe shape, are embedded with the insulator films 31, an upper portion of the insulator films 31 is removed and flattened through a chemical mechanical polishing (CMP) technique, to expose the upper surface of the amorphous silicon layer 6*a*.

Then, as illustrated in FIG. 6, the insulator film 11, an amorphous silicon layer 21*a*, the insulator film 12, an amorphous silicon layer 22*a*, the insulator film 13, an amorphous silicon layer 23*a*, the insulator film 14, an amorphous silicon layer 24*a*, the insulator film 15, an amorphous silicon layer 61*a*, the insulator film 71, and an amorphous silicon layer 25*a* are formed in order through, for example, the CVD (chemical vapor deposition) technique. The amorphous silicon layer 25*a* is doped with impurities (for example, phosphorous (P)) of the same conductivity type as that of the amorphous silicon layer 6*a*.

Figure 7:
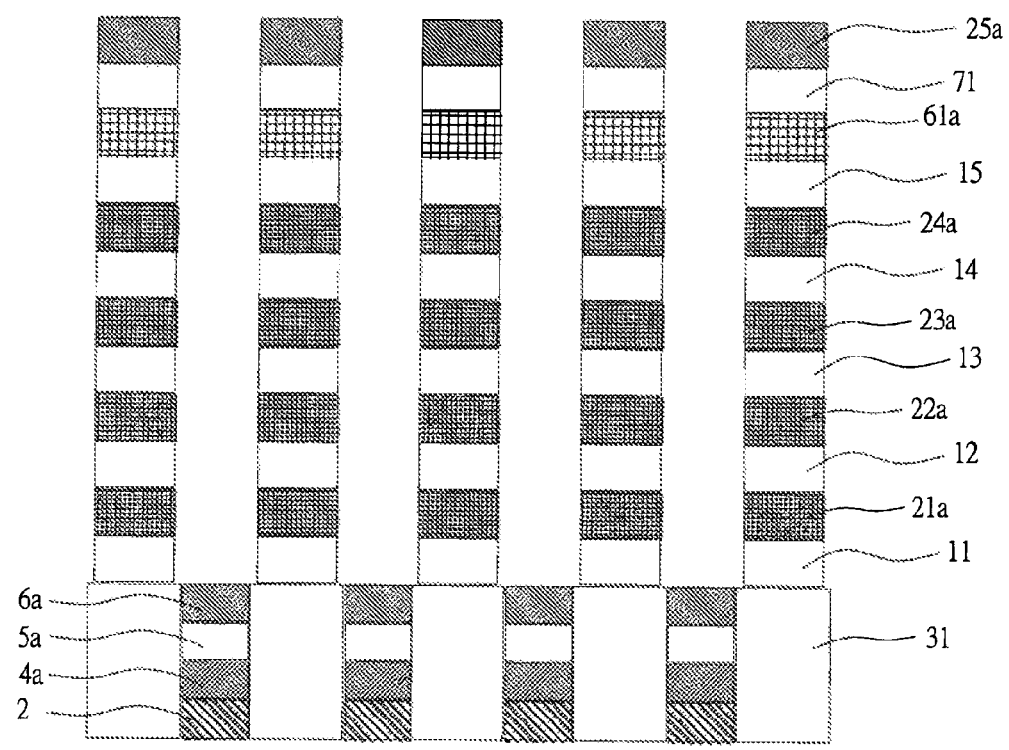
FIG. 7 is a cross-sectional view illustrating the method for manufacturing the vertical chain memory subsequent to FIG. 6.

Then, as illustrated in FIG. 7, the stacked film formed in the process described with reference to FIG. 6 is processed into stripes extending in a direction (first direction) parallel to the extending direction of the word lines 2 to expose an upper surface of the amorphous silicon layer 6*a*. In this situation, the stacked film is processed so that the space portions between the respective stacked films including the insulator films 11 to 15, and 71, and the amorphous silicon layers 21*a* to 25*a*, and 61*a* are positioned immediately above the word lines 2.

A width of the stacked films in the second direction orthogonal to the first direction may be thinner than a width of the insulator films 31 in the same direction. That is, the stacked films may not be formed immediately above the amorphous silicon layers 4*a* to 6*a* that form the polysilicon diode PD (refer to FIG. 1), and the stacked films may not be formed immediately above ends of the insulator films 31 in the second direction. With this configuration, when the insulator film 9 which will be described later is formed, the space portions between the respective stripe patterns of the stacked film can be prevented from being shortened more than the respective widths of the amorphous silicon layer 4*a*, 5*a*, and 6*a* in the second direction. As a result, when a polysilicon layer formed by heating the amorphous silicon layers 4*a* to 6*a* is processed into stripes in a process after the insulator film 9 has been formed, the polysilicon layer can be prevented from partially remaining to enhance the reliability of the memory operation.

Figure 8:
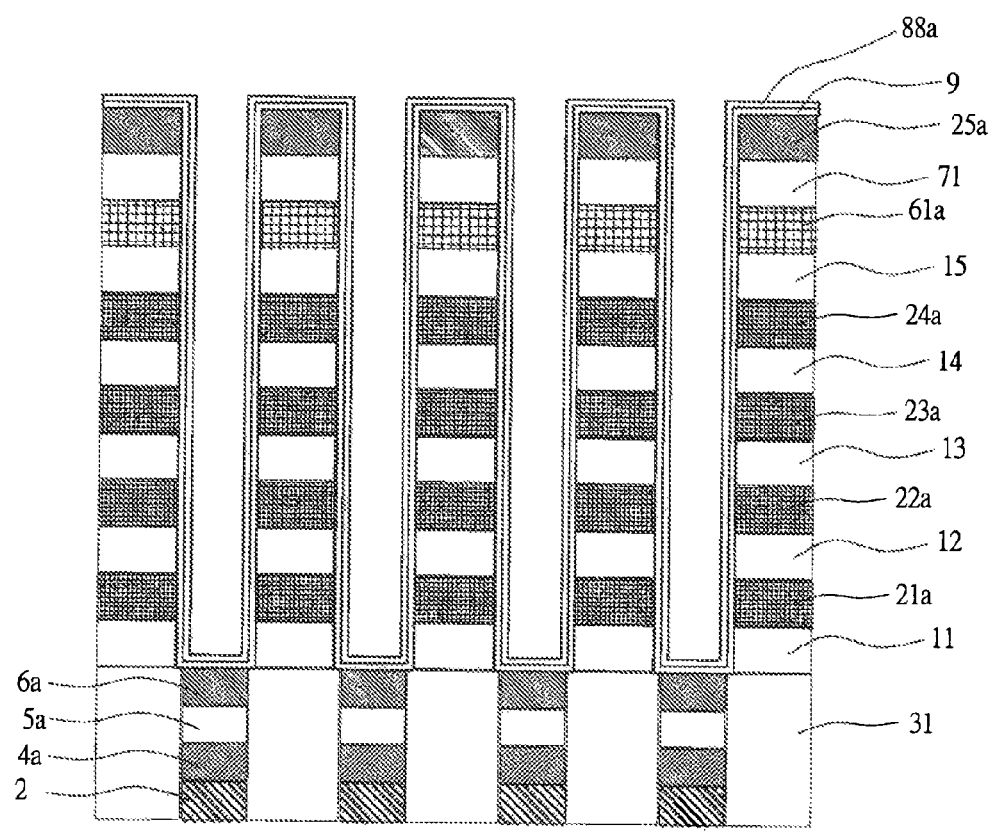
FIG. 8 is a cross-sectional view illustrating the method for manufacturing the vertical chain memory subsequent to FIG. 7.

Then, as illustrated in FIG. 8, the insulator film 9 and an amorphous silicon layer 88*a* are sequentially formed so as not to be completely embedded in the spaces of the respective stacked films formed in the process described with reference to FIG. 7.

Figure 9:
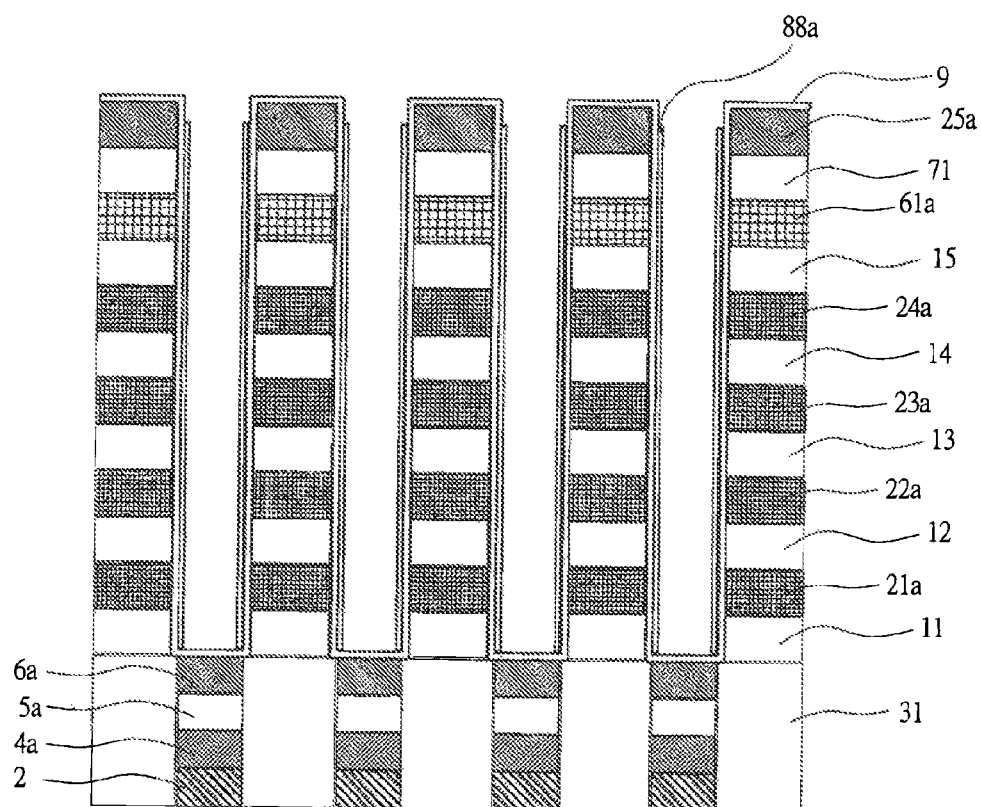
FIG. 9 is a cross-sectional view illustrating the method for manufacturing the vertical chain memory subsequent to FIG. 8.

Then, as illustrated in FIG. 9, the amorphous silicon layer 88a formed on the amorphous silicon layer 25a and the amorphous silicon layer 6a through the insulator film 9 is partially removed by etch-back. That is, the amorphous silicon layer 88a formed on the stacked films and the bottoms of the grooves between the respective stacked films are removed, and the amorphous silicon layer 88a remain on only the sidewalls of the stacked films.

In this situation, a height of the uppermost surface of the amorphous silicon layer 88a is set to be higher than an uppermost surface of the amorphous silicon layer 61a. This is because when an uppermost portion of the insulator film 9 is partially removed in a subsequent process, the uppermost surface of the insulator film 9 is prevented from being lower than the uppermost surface of the amorphous silicon layer 61a so as not to short-circuit an amorphous silicon layer 89a formed in a subsequent process (refer to FIG. 12) and the amorphous silicon layer 61a.

Figure 10:
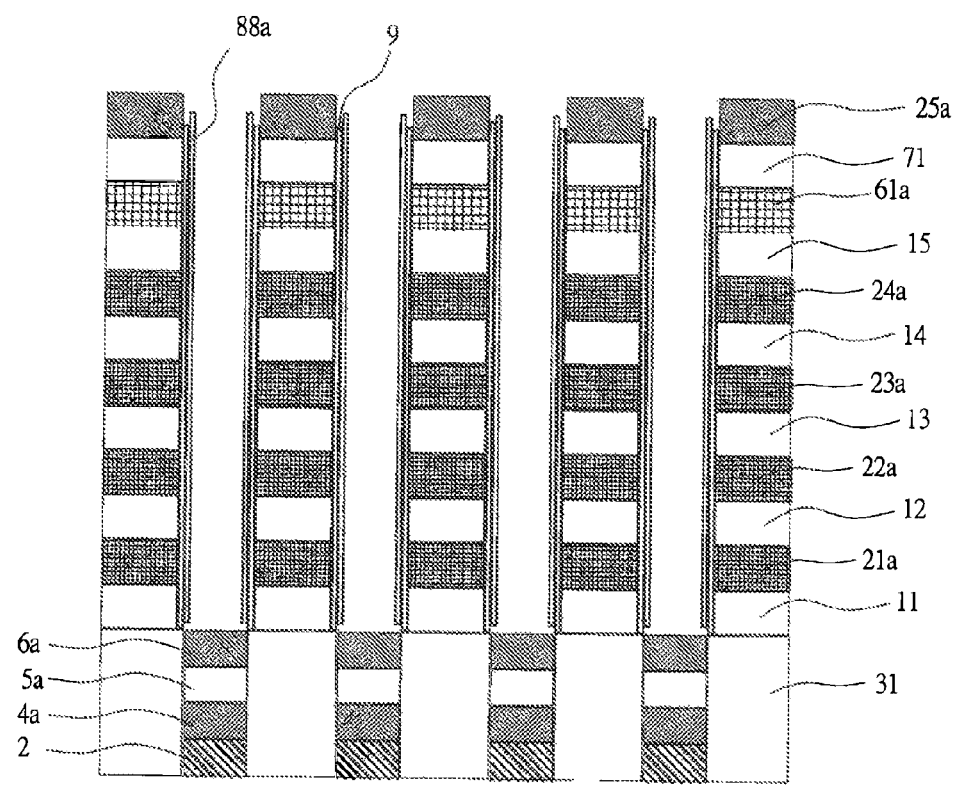
FIG. 10 is a cross-sectional view illustrating the method for manufacturing the vertical chain memory subsequent to FIG. 9.

Subsequently, as illustrated in FIG. 10, the insulator film 9 having a surface exposed is partially removed by wet etching. The wet etching is conducted more than the thickness to retreat the insulator film 9, and the height of the uppermost surface of the insulator film 9 becomes lower than the height of the uppermost surface of the amorphous silicon layer 88a. As a result, as compared with a case in which the height of the uppermost surface of the insulator film 9 is located in a region identical with or higher than the height of the uppermost surface of the amorphous silicon layer 88a, the insulator film 9 can be effectively prevented from being damaged in a subsequent etching process.

Also, the insulator film 9 is retreated in a horizontal direction in the vicinity of the upper surface of the amorphous silicon layer 6a, that is, in the bottom of the grooves between the respective stacked films, and the insulator film 9 at the bottom of the amorphous silicon layer 88a is removed to expose the upper surface of the amorphous silicon layer 6a.

Figure 11:
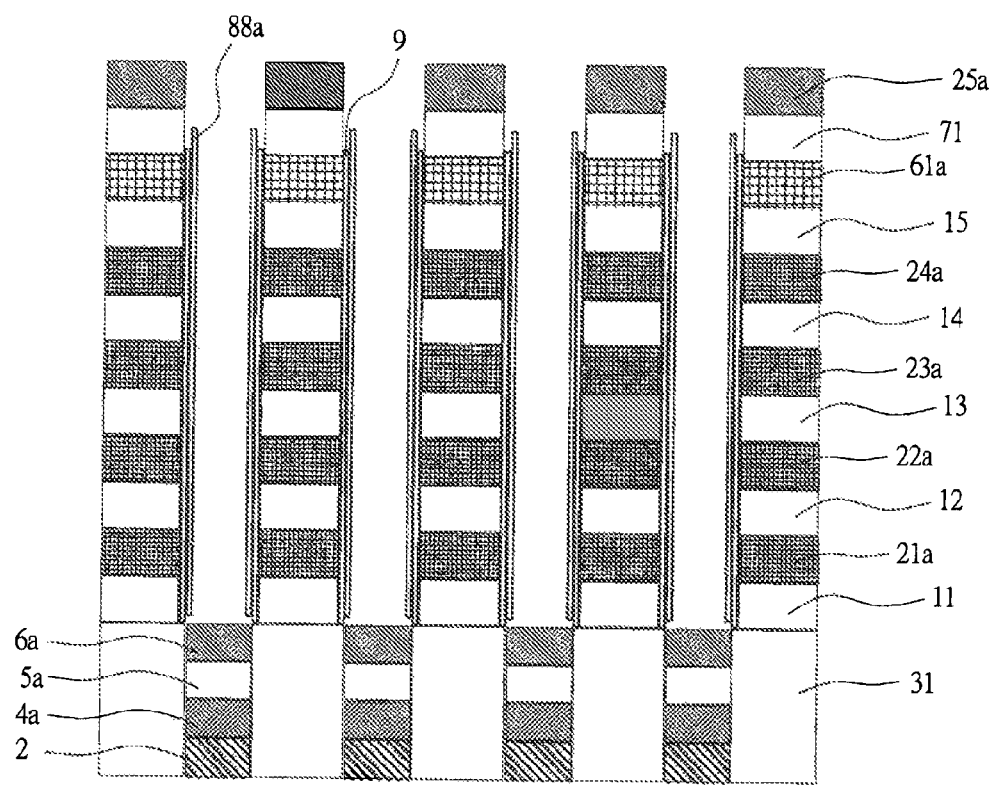
FIG. 11 is a cross-sectional view illustrating a modified example of the method for manufacturing the vertical chain memory according to the first embodiment of this invention.

In the process of removing the amorphous silicon layer 88a and the insulator film 9 described with reference to FIGS. 9 and 10, a method according to a modified example descried below can be used. In the etch back process described with reference to FIG. 9, the amorphous silicon layer 88a is etched back so that the uppermost surface of the amorphous silicon layer 88a is prevented from being lower than the bottom surface of the amorphous silicon layer 25a, and also lower than the uppermost surface of the amorphous silicon layer 61a. Thereafter, as illustrated in FIG. 11, the insulator film 9 is wet-etched so that the uppermost surface of the insulator film 9 becomes lower than the bottom surface of the amorphous silicon layer 25a. In this situation, as will be described later, the height of the uppermost surface of the insulator film 9 is set to be lower than the bottom surface of the amorphous silicon layer 25a so that a current path of the phase change memory can be shortened, and high speed operation of the nonvolatile storage device can be conducted.

Thus, after the amorphous silicon layer 88a is formed on the sidewalls of the stacked film, the exposed insulator film 9 is partially removed by etching, thereby being capable of preventing the insulator film 9 from being damaged by an etching gas used in the etching process. Also, the insulator film 9 can be prevented from being abraded and removed by a cleaning solution (for example, hydrofluoric acid (HF: hydrofluoric acid) used in the subsequent cleaning process. As a result, the reliability of the nonvolatile storage device can be improved.

Figure 12:
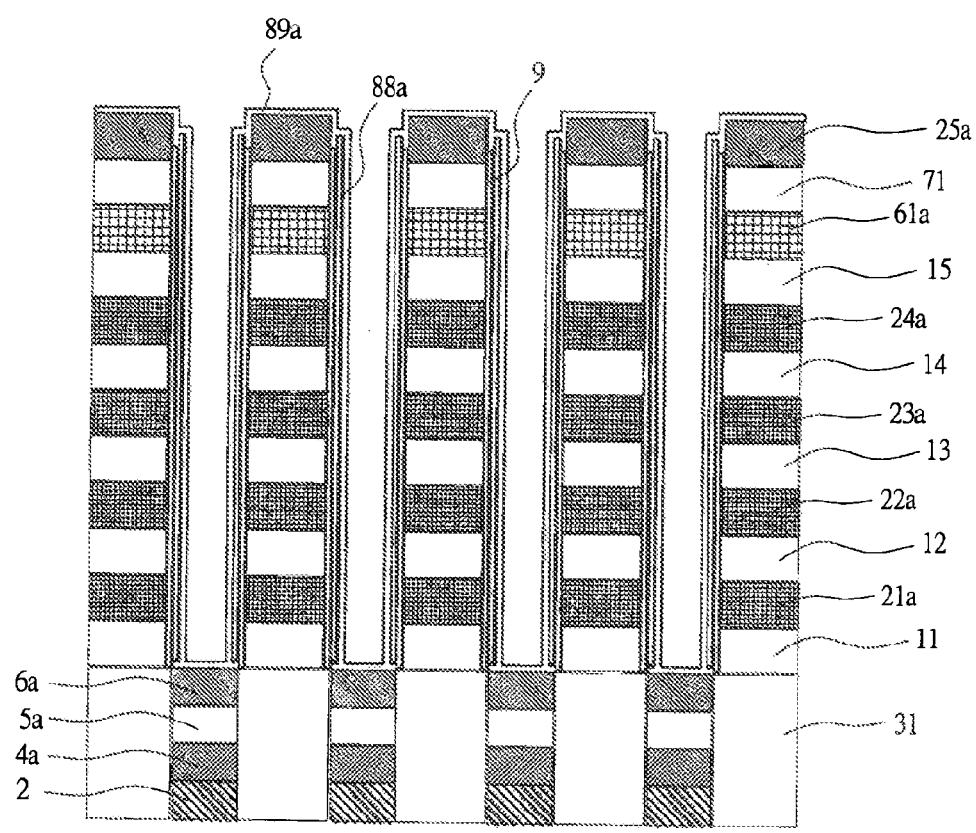
FIG. 12 is a cross-sectional view illustrating the method for manufacturing the vertical chain memory subsequent to FIG. 10.

Then, as illustrated in FIG. 12, the amorphous silicon layer 89a is formed on the semiconductor substrate 1 (not shown) through, for example, the CVD technique. In this case, the amorphous silicon layer 89a is so formed as not to be completely embedded between the respective stacked films. The amorphous silicon layer 89a is formed to cover the amorphous silicon layer 88a, the insulator film 9, the amorphous silicon layer 25a, and the upper surface of the amorphous silicon layer 6a. The amorphous silicon layer 89a comes in contact with the amorphous silicon layer 88a, the amorphous silicon layer 25a, and the amorphous silicon layer 6a.

Figure 13:
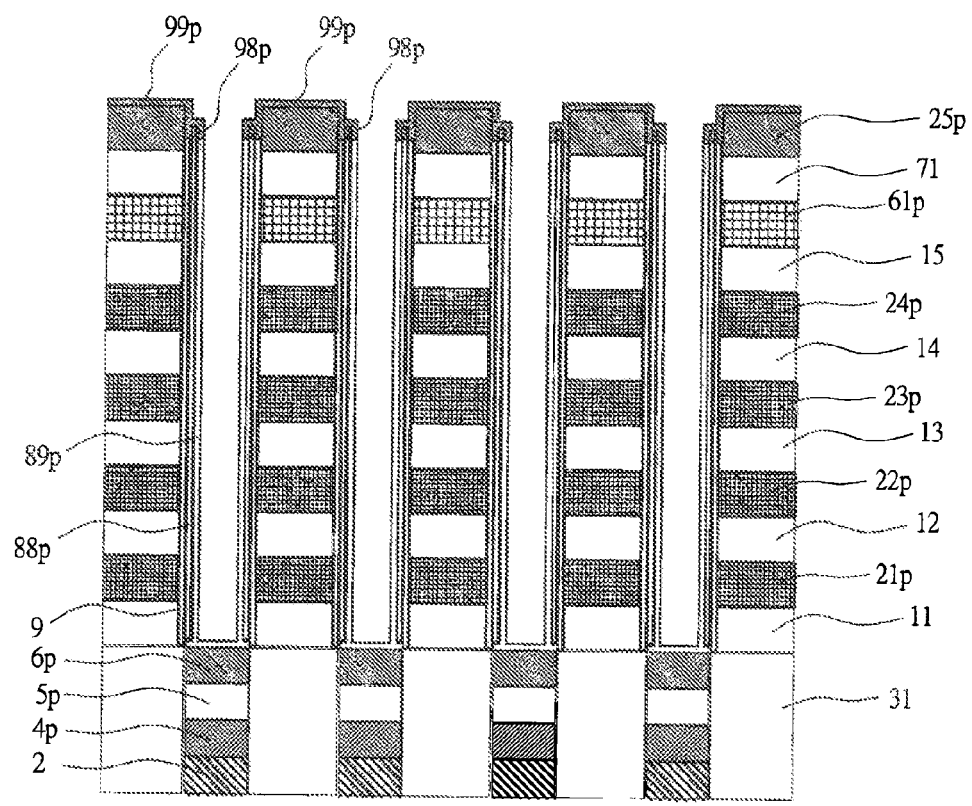
FIG. 13 is a cross-sectional view illustrating the method for manufacturing the vertical chain memory subsequent to FIG. 12.

Subsequently, as illustrated in FIG. 13, an insulating film is formed on the semiconductor substrate 1 (not shown), and the amorphous silicon layers 4a, 5a, 6a, 88a, 89a, 21a, 22a, 23a, 24a, 25a, and 61a are crystallized, and the impurities included in those layers are activated due to annealing. As a result, the amorphous silicon layers 4a, 5a, 6a, 88a, 89a, 21a, 22a, 23a, 24a, 61a, and 25a become the polysilicon layers 4p, 5p, 6p, 88p, 89p, 21p, 22p, 23p, 24p, 61p, and 25p, respectively. Because phosphorus (P) which is n-type impurities included in the amorphous silicon layer 25a diffuse into the amorphous silicon layers 88a and 89a, a part of the amorphous silicon layers 88a and 89a become the polysilicon layers 98p and 99p higher in the concentration of the n-type impurity than the polysilicon layers 88p and 89p. The polysilicon layers 98p and 99p are formed in contact with the upper surface and the side surfaces of the polysilicon layer 25p. Thereafter, the insulator film is removed by wet etching.

Figure 14:
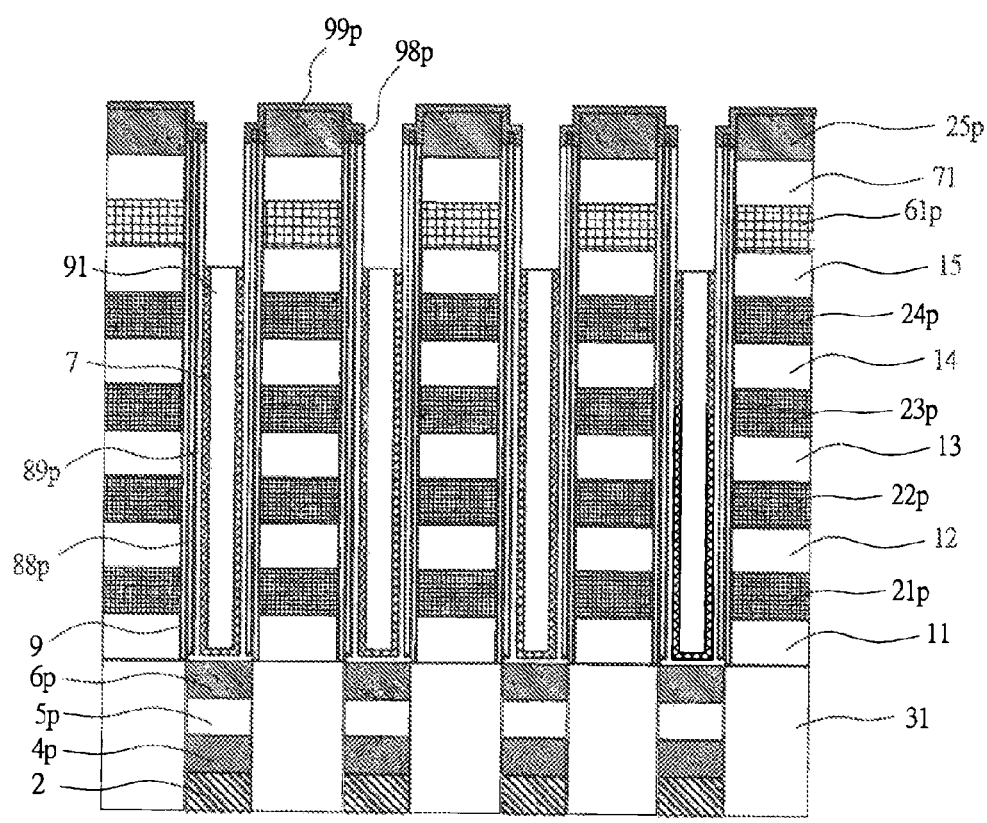
FIG. 14 is a cross-sectional view illustrating the method for manufacturing the vertical chain memory subsequent to FIG. 13.

Subsequently, as illustrated in FIG. 14, after the insulator film and the phase change material layer 7 has been formed in order so as not to be completely embedded in the spaces between the respective stacked films, the insulator film 91 is so formed as to be completely embedded in the space. In FIG. 14, although not shown in FIG. 14 for facilitation to understand the drawing, the above insulator film is formed between the polysilicon layer 99p and the phase change material film 7. The insulator film is provided to prevent impurities from diffusing between the polysilicon layer 99p and the phase change material film 7.

Subsequently, upper portions of the phase change material film 7 and the insulator film 91 are partially removed by etch-back so that the height of the uppermost surface of the phase change material film 7 becomes lower than the height of the uppermost surface of the insulator film 15, and higher than the height of the bottom surface of the insulator film 15. The reason that the height of the uppermost surface of the phase change material film 7 is set to be lower than an height of the uppermost surface of the insulator film 15 is that a current is prevented from flowing in a source/drain through the phase change material film 7 when the gate of the select transistor having the polysilicon layer 61p as the gate electrode turns off. Also, the reason that the height of the uppermost surface of the phase change material film 7 is set to be higher than an elevation of the lowermost surface of the insulator film 15 is that a current is allowed to flow in the source/drain through the phase change material film 7 when the gate of the cell transistor having the polysilicon layer 24p formed immediately below the insulator film 15 as the gate electrode turns off. In this case, the upper portion of the insulator film 91 is also partially removed at the same time, and the height of the uppermost surface of the insulator film 91 is substantially identic with the height of the uppermost surface of the phase change material film 7.

Figure 15:
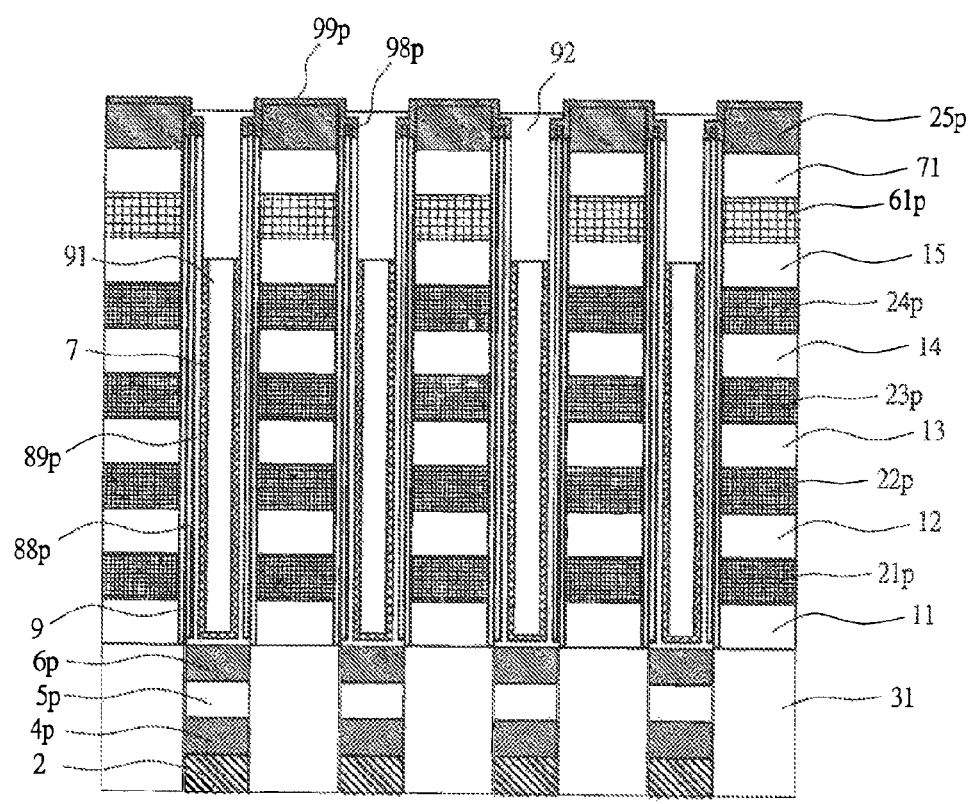
FIG. 15 is a cross-sectional view illustrating the method for manufacturing the vertical chain memory subsequent to FIG. 14.

Then, as illustrated in FIG. 15, the insulator film 92 is formed over the semiconductor substrate 1 (not shown) so as to be embedded in the spaces between the respective stacked films. Thereafter, an upper portion of the insulator film 92 is partially removed by etch-back to expose the uppermost surface of the polysilicon layer 99p. Subsequently, the contact plug BLC (refer to FIG. 1) that connects the bit line 3 to the peripheral surfaces formed on the semiconductor substrate 1 is formed.

Figure 16:
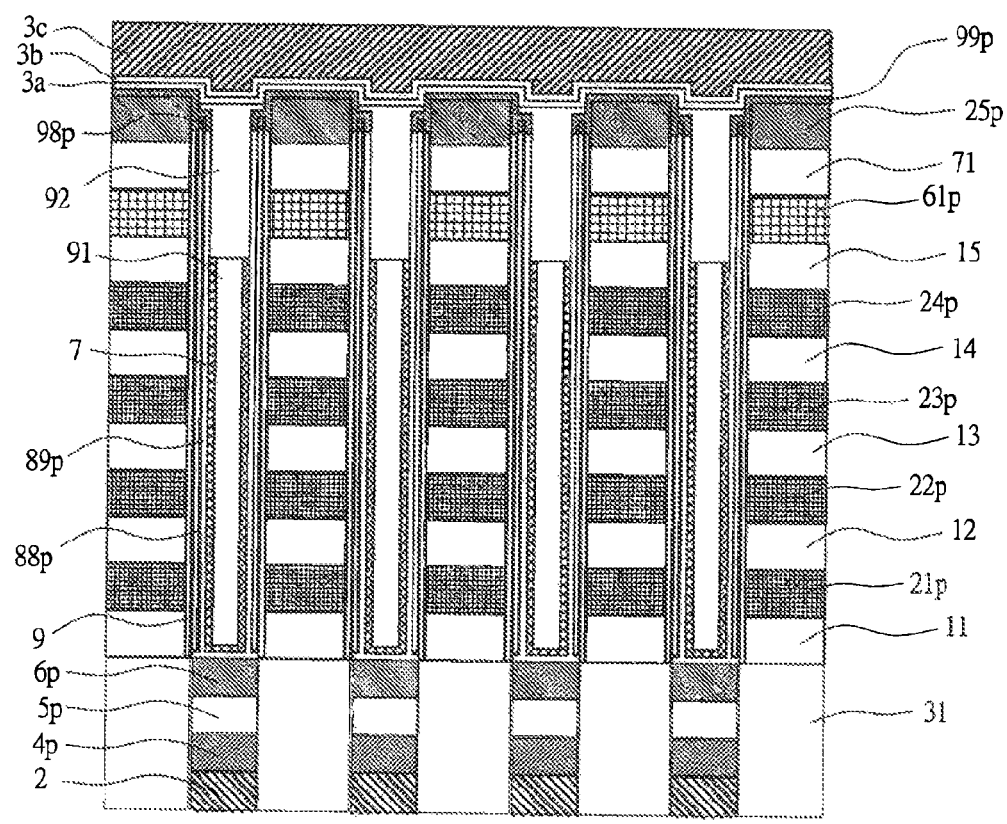
FIG. 16 is a cross-sectional view illustrating the method for manufacturing the vertical chain memory subsequent to FIG. 15.

Then, as illustrated in FIG. 16, the metal films 3a, 3b, and 3c are formed on the polysilicon layer 99p in turn through, for example, sputtering. The metal films 3a, 3b, and 3c can be made of, for example, titanium, titanium nitride, and tungsten, respectively. The metal film 3a is a film provided to improve an adhesion between the metal film 3b and the semiconductor layer at the bottom of that metal film. Also, the metal film 3b is a barrier film for preventing metal grains configuring the metal film 3c which is a line mainly containing tungsten from diffusing into the semiconductor layer and the insulator film at the bottom of the metal film 3c.

In this example, before the metal film 3a made of, for example, titanium, is formed, sputter etching is conducted in order to remove natural oxide formed on a surface of the polysilicon layer 99p. Due to the sputter etching process in this situation, or the cleaning process for removing an etching residue produced by those etching, the polysilicon layer 99p on the polysilicon layer 25p may be abraded to be extremely thinned, and removed to expose a surface of the lower film of the polysilicon layer 99p. In particular, as the thickness of the polysilicon layer 99p is thinned more for reducing the element size, the polysilicon layer 99p is more remarkably abraded and eliminated. Also, even if the polysilicon layer 99p on the stacked film is not removed, if the thickness of the polysilicon layer 99p on the stacked film is thinner than the thickness of the polysilicon layer 89p on the sidewalls of the stacked film, there is a risk that the contact resistance between the polysilicon layer 99p and the metal film 3a is increased.

When the polysilicon layer 25p is not formed on the uppermost portion of the stacked film, and the insulator film 71 is arranged on the uppermost portion of the stacked film as in the vertical chain memory which is a comparative example illustrated in FIG. 28, and the polysilicon layer 99p immediately above the stacked film is removed, a contact area between the metal film 3a and the polysilicon layer 99p that remains on each sidewall of the insulator film 71 becomes very small. For that reason, a contact resistance between the vertical chain memory and the bit line 3 (refer to FIG. 1) formed on top of the vertical chain memory becomes very high. As a result, a sufficient current is not allowed to flow in the vertical transistor, program and read of the phase change memory cannot normally been conducted. That is, there arises such a problem that the reliability of the nonvolatile storage device is lessened.

That is, if the amorphous silicon layer 25a is not formed in the process described with reference to FIG. 6, when the etch-back for removing the insulator film described with reference to FIG. 15, or the sputter etching for removing the above-mentioned natural excide is conducted, the polysilicon layer 99p on the insulator film 71 may be abraded, and the polysilicon layer may be eliminated on the uppermost surface of the stacked film to expose the insulator film 71, as illustrated in FIG. 28. In this case, when the metal film 3a is continuously formed, only the upper portion of the polysilicon layer 99p that remains on each sidewall of the stacked film comes in contact with the metal film 3a.

In comparison between a case in which a polysilicon layer remains on the overall upper surface of the stacked film, and an upper surface of the polysilicon layer and the metal film 3a are electrically connected to each other, and a case in which the polysilicon layer on the upper surface of the stacked film is removed, and the stacked film on the upper surface of the stacked film is exposed, and only the upper surface of the polysilicon layer 99p on each sidewall of the stacked film is electrically connected to the metal film 3a, the contact area of the polysilicon layer and the metal film 3a in the former case is far larger. Therefore, when the polysilicon layer 25p is not formed, the polysilicon layer on the upper surface of the stacked film is removed by the etching process, because the contact area between the bit lines 3 (refer to FIG. 1) and the diffusion layer of the vertical chain memory becomes very small, the contact resistance of the bit lines 3 and the diffusion layer of the vertical chain memory is increased.

Figure 17:
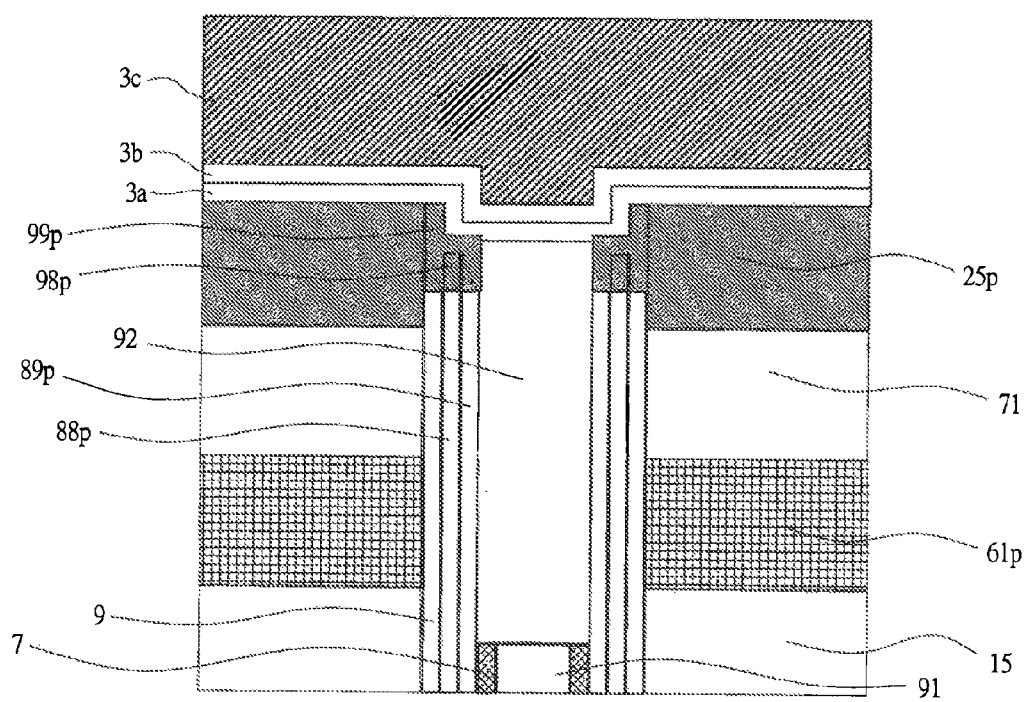
FIG. 17 is a cross-sectional view illustrating a modified example of the method for manufacturing the vertical chain memory according to the first embodiment of this invention.

In this embodiment, even if the polysilicon layer 99p is abraded and eliminated, the polysilicon layer 25p remains as the diffusion layer as illustrated in FIG. 17. FIG. 17 is a cross-sectional view illustrating a modified example of the method for manufacturing the vertical chain memory according to this embodiment, which is an enlarged cross-sectional view illustrating a region in which the channel semiconductor layer of the vertical transistor is electrically connected to the bit lines on top of the semiconductor layer.

Therefore, the polysilicon layer 25p that forms a current path of the vertical chain memory is formed on the insulator film 71 whereby a contact resistance between the bit lines 3 (refer to FIG. 1) including the metal films 3a to 3c formed on the polysilicon layer 25p, and the diffusion layer of the vertical chain memory, that is, the polysilicon layers 25p and 99p can be sufficiently reduced. As a result, even if the polysilicon layer 99p on the polysilicon layer 25p is removed, a sufficient current can flow into the vertical transistor configuring the vertical chain memory through the polysilicon layer 25p. As a result, the program and read of the phase change memory can normally been conducted. Accordingly, the performance of the nonvolatile storage device can be improved.

Thus, even if the polysilicon layer 99p on the stacked film is thinned or removed, when the metal films 3a to 3c are formed, the contact area between the polysilicon layer 25p and the metal film 3a can be largely ensured on the upper surface of the polysilicon layer 25p as illustrated in FIG. 17.

Then, the metal films 3a to 3c, the polysilicon layers 99p, 98p, and 25p, the insulator film 92, the polysilicon layers 89p and 88p, the stacked film (not shown) between the polysilicon layer 99p and the phase change material film 7, the phase change material film 7, the insulator film 91, the polysilicon layers 6p, 5p, and 4p are processing into the strip shape extending in a direction (second direction) orthogonal to the extending direction of the word lines 2. As a result, the bit lines 3 (refer to FIG. 2) including the metal films 3a to 3c which are lines on the stripes are formed.

Figure 18:
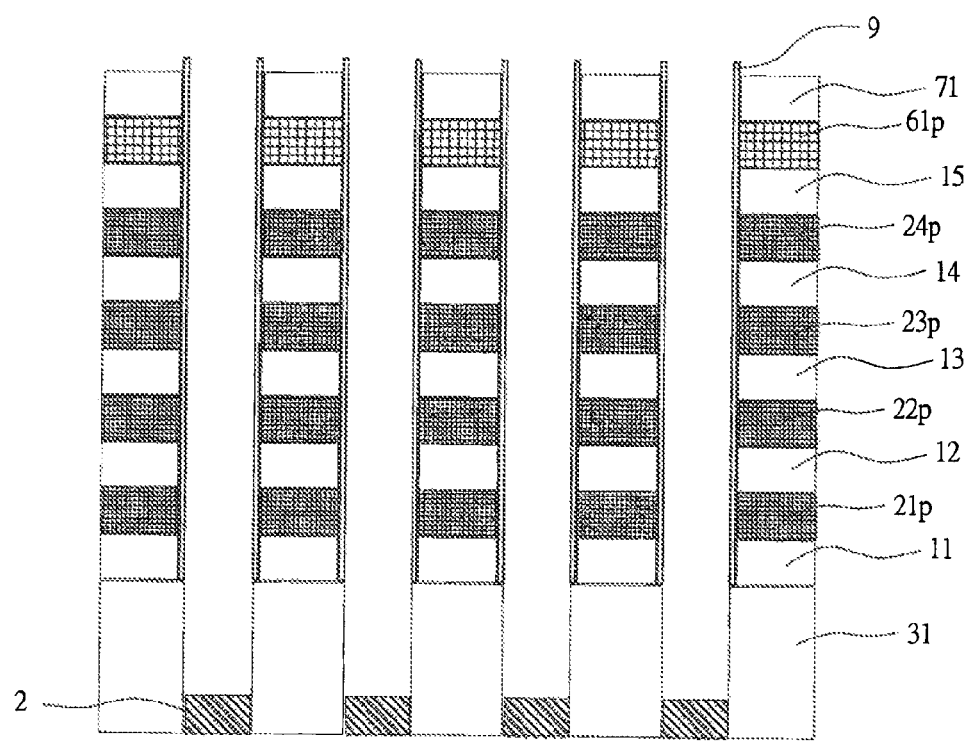
FIG. 18 is a cross-sectional view illustrating the method for manufacturing the vertical chain memory subsequent to FIG. 16.

Accordingly, as illustrated in FIG. 18, when the bit lines 3 are processed into the stripe shape, the stacked film including the polysilicon layers 21p to 24p, and 61p of processing portions, the insulator films 11 to 15, and 71, the insulator film 9, and the word lines 2 remain without being processed, however, the polysilicon layers 88p, 89p, 98p, and 99p of the processing portions, and the phase change material film 7 are removed. Also, the polysilicon layers 4p to 6p on the word lines 2 are removed simultaneously together with the processing into the stripe shape to intermittently form the plurality of polysilicon diodes PD (refer to FIG. 1) including the polysilicon layers 4p to 6p at given intervals in the first direction.

As illustrated in FIG. 2, the structure including the polysilicon layers 88p and 89p, the phase change material film 7, the polysilicon layer 99p, and the insulator film (not shown) between the polysilicon layer 99p and the phase change material film 7 in the vertical chain memory is formed to be self-aligned to the bit lines 3. As a result, a stacking displacement can be prevented as compared with a case in which layers each having a specific shape are formed in order, and the reliability of the memory program operation can be enhanced. Also, since the structure including the bit lines 3 to the upper surface of the word lines 2 is processed simultaneously, whereby the polysilicon diodes PD can be further formed to be self-aligned to the bit lines 3. Accordingly, since the number of masks for the working process can be reduced, the manufacturing costs can be reduced.

Thereafter, the contract plugs for connecting the polysilicon layer of the memory cell array end to the lines or the element on each layer are formed, and the overall structure on the semiconductor substrate such as the memory cell array including the portion processed into the stripe shape during the manufacturing process is embedded with the interpoly dielectric film through the process described with reference to FIG. 18. The interpoly dielectric film forms the insulator films 33 shown in FIG. 4(b). As a result, the insulator films 33 are embedded immediately below the respective plural bit lines 3 aligned in the first direction, and between the adjacent stacked films in the second direction and between the adjacent insulator films 31 in the second direction. Then, after the gate electrodes, and the contact plugs extending to the polysilicon layers 21p to 24p, and 61p functioning as the gate electrodes are formed, the lines GL1, GL2, GL3, GL4, STGL1, and STGL2 are formed on the contact plugs. Subsequently, after the contact plugs that connect the lines GL1 to GL4, STGL1, and STGL2 to the peripheral circuits are formed, the global bit line GBL is formed on the line GL1, to thereby complete the nonvolatile storage device according to this embodiment illustrated in FIG. 1.

In the nonvolatile storage device according to this embodiment, even if the thickness of the polysilicon layer which is the channel semiconductor layer is thinned, since the contact resistance between the diffusion layer of the vertical transistor configuring the vertical chain memory and the bit lines can be sufficiently reduced, the memory operation can be stably conducted. When the thickness of the polysilicon layer which is the channel semiconductor layer is thinned, if polysilicon layer 25p (refer to FIG. 1) which is the conductive layer is not formed as in the comparative example illustrated in FIG. 28, the contact resistance between the bit lines and the diffusion layer largely rises. On the contrary, in the structure according to this embodiment, even if the thickness of the channel semiconductor layer is thinned, the contact resistance between the bit lines and the diffusion layer hardly rises. Accordingly, even if a bit cost reduction is promoted due to the size reduction by thinning the thickness of the channel semiconductor layer, the reliability of the nonvolatile storage device can be sufficiently maintained. For the above reason, the thickness of the polysilicon layer 25p needs to be sufficiently thicker than the thickness of the polysilicon layer 99p.

Also, in this embodiment, as illustrated in FIG. 17, the uppermost surface of the insulator film 9 is located in a region higher than the bottom surface of the polysilicon layer 25p. In this case, when a current flowing between the polysilicon layers 88p, 89p, and 99p, and the bit lines 3 (refer to FIG. 1) flows through the polysilicon layer 25p, a current flowing between the polysilicon layer 25p and the polysilicon layers 88p, 89p flows into the polysilicon layers 98p and 99p so as to go around an upper portion of the insulator film 9. Thus, the insulator film 9 extends to a position higher than the height of the bottom of the polysilicon layer 25p to lengthen a path of the current flowing into the vertical chain memory. As a result, the power consumption increases in association with a reduction in the operating speed of the nonvolatile storage device or an increase of the resistivity.

Accordingly, as described with reference to FIG. 11, it is preferable that the height of the uppermost surface of the insulator film 9 is formed at a position lower than the bottom surface of the polysilicon layer 25p. However, as described above, the height of the uppermost surface of the insulator film 9 needs to be higher than the height of the uppermost surface of the polysilicon layer 24p. Thus, the insulator film 9 is formed so that the height of the uppermost surface of the insulator film 9 is located in a region lower than the bottom surface of the polysilicon layer 25p. As a result, a current flowing between the polysilicon layer 25p, and the polysilicon layers 89p, 99p can shorten the current path as compared with a case in which the uppermost surface of the insulator film 9 is located in a region higher than the bottom surface of the polysilicon layer 25p. The current path of the vertical chain memory is shortened to improve the operating speed of the nonvolatile storage device. Also, the resistivity of the current path in the vertical chain memory is decreased to reduce the power consumption in the nonvolatile storage device.

The drawings in this embodiment illustrate an example in which four layers of the polysilicon layers 21p to 24p which are the gate electrodes of the memory cells are stacked together. However, the number of stacks can be five or more.

Second Embodiment

In the first embodiment, as described with reference to FIG. 7, the stacked film including the insulator film 11, the amorphous silicon layer 21a, the insulator film 12, the amorphous silicon layer 22a, the insulator film 13, the amorphous silicon layer 23a, the insulator film 14, the amorphous silicon layer 24a, the insulator film 15, the amorphous silicon layer 61a, the insulator film 71, and the amorphous silicon layer 25a is processed into the stripe shape to form the spaces in which the channel layers of the vertical chain memory are formed. In this embodiment, a description will be given of a method in which the stacked film is not processed into the stripe shape when processing the stacked film, but a plurality of holes is formed into the stacked film, and channel layers of the vertical chain memory are formed in the respective holes.

Figure 19:
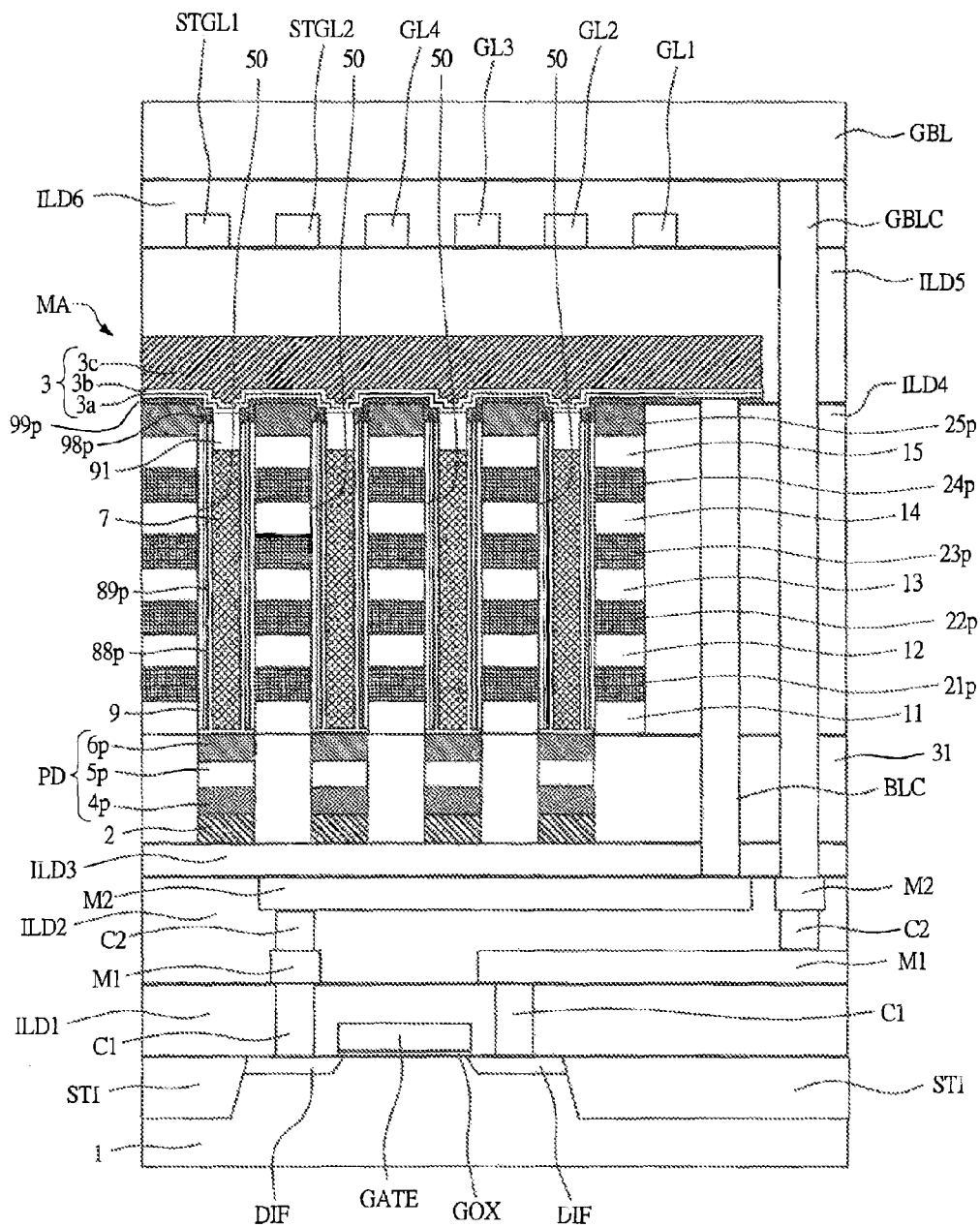
FIG. 19 is a cross-sectional view of a vertical chain memory according to a second embodiment of this invention.

FIG. 19 is a cross-sectional view of a nonvolatile storage device according to an embodiment of this invention, which illustrates a part of a memory cell array, lines, and contact plugs having substantially the same structure as that of the nonvolatile storage device according to the first embodiment. However, the insulator films 11 to 15 and the polysilicon layers 21p to 24p each have not a stripe shape but a plate-like shape along a main surface of the semiconductor substrate 1. In a stacked film of those films, a plurality of holes 50 extended to an upper surface of a silicon layer 6p is formed in a matrix. The polysilicon layer 25p does not extend in the first direction which is the extending direction of the word lines 2, but has a stripe shape extending in the same direction as that of the bit lines 3 that are stripe patterns extending in the second direction.

Also, the polysilicon layer 61p and the insulator film 71 illustrated in FIG. 1 are not formed in the stacked film. This is because a plurality of memory cells connected in series is not formed in two lines within the holes 50 as in the first embodiment, but a plurality of memory cells connected in series is formed in only one line, and a select transistor for selecting any one of memory cell groups formed in two lines does not need to be provided within the holes 50.

In the vertical chain memory illustrated in FIG. 19, the phase change material film 7 is embedded within each of the holes 50 in the center thereof, and the polysilicon layers 88p and 89p which are channel semiconductor layers surrounding the phase change material film 7 are formed on the inner wall of the hole 50. Different memory cells are not formed on facing inner walls of the hole 50. Accordingly, the word lines 2 and the bit lines 3 are each connected by one current path including a polysilicon diode PD and a plurality of memory cells connected in series.

As illustrated in FIG. 19, the insulator film 9, the polysilicon layers 88p, 89p, the insulator film (not shown), and the phase change material film 7 formed in order from an inner wall side of the hole 50 are embedded within the holes 50 as illustrated in FIG. 19. The insulator film 91 is interposed between the upper surface of the phase change material film 7 and the bottom surface of the bit line 3. The uppermost surface of the phase change material film 7 is located in a region higher than the upper surface of the polysilicon layer 24p and lower than the bottom surface of the polysilicon layer 25p. The insulator film (not shown) formed between the polysilicon layer 89 and the phase change material film 7 is a layer for preventing impurities from diffusing between the phase change material film 7 and the polysilicon layer 89p.

In the bottom of the hole 50, an upper surface of the polysilicon layer 6p and a bottom surface of the polysilicon layer 89p come in contact with each other. The bit line 3 and the polysilicon diode PD are joined together within the hole 50 through the polysilicon layer 99p, 98p, 25p, 88p, and 89p.

Figure 20:
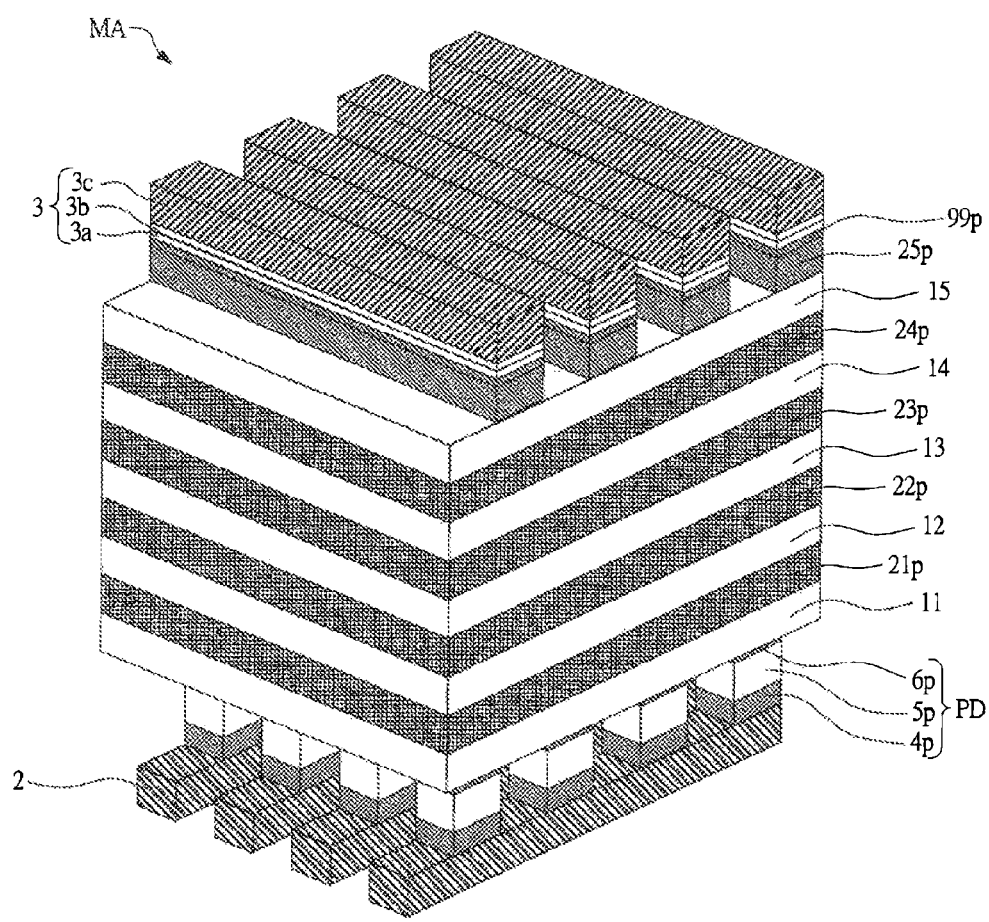
FIG. 20 is a bird' eye view of the vertical chain memory according to the second embodiment of this invention.

FIG. 20 is a bird' eye view illustrating, particularly, an extracted portion of the memory cell array MA in FIG. 19. As illustrated in FIG. 20, a plurality of the polysilicon diodes PD is periodically formed on each of a plurality of word lines 2 in the extending direction of the word lines 2. A plurality of holes (connection holes) 50 (not shown) extended to the polysilicon didoes is formed in the stacked film including the plate-like polysilicon layers 21p, 22p, 23p, and 24p which are the gate electrodes, and the insulator films 11, 12, 13, 14, and 15. The bit lines 3 are formed on the stacked film through the respective polysilicon layers 25p. The bit lines 3 and the polysilicon layers 25p are extended in the second direction, and aligned in the first direction in plurality number. The holes 50 and the polysilicon diodes PD are formed at intersections where the bit lines 3 and the word lines 2 cross each other in a plan view, and therefore are arranged in a matrix.

Figure 21:
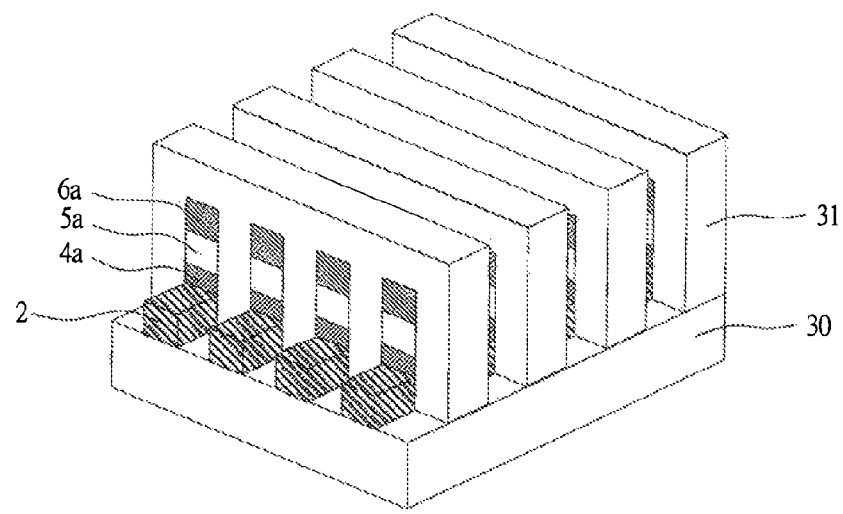
FIG. 21 is a bird's eye view illustrating a method for manufacturing the vertical chain memory according to the second embodiment of this invention.
Figure 22:
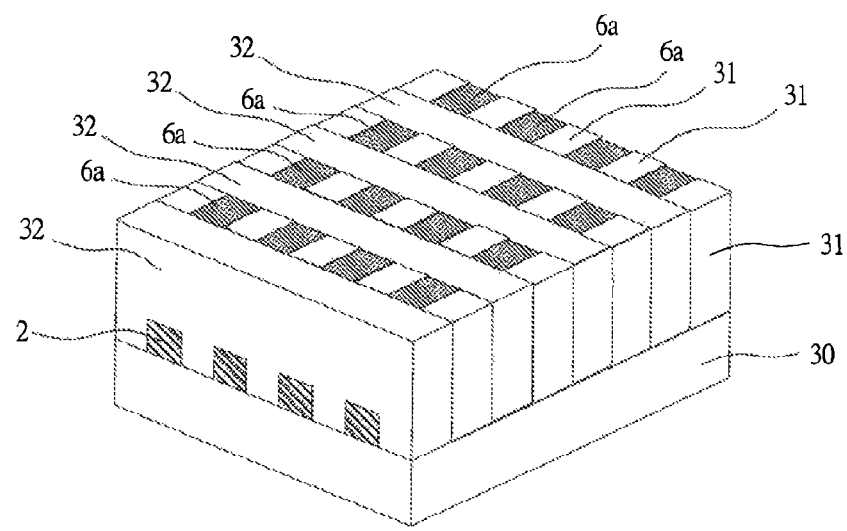
FIG. 22 is a bird's eye view illustrating the method for manufacturing the vertical chain memory subsequent to FIG. 21.
Figure 23:
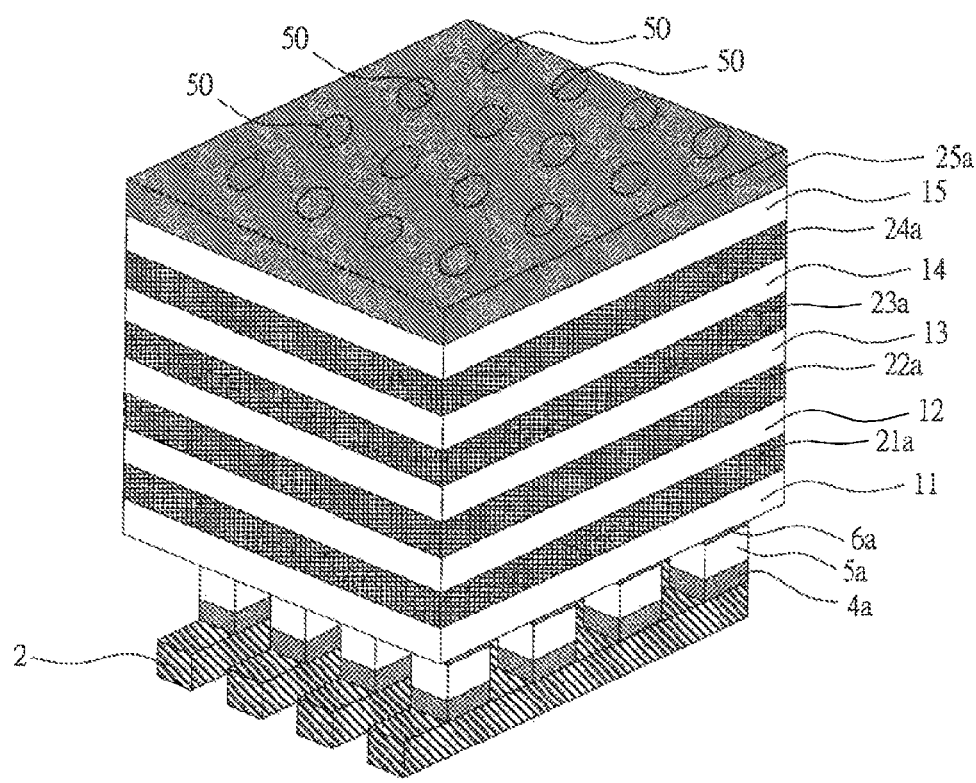
FIG. 23 is a bird's eye view illustrating the method for manufacturing the vertical chain memory subsequent to FIG. 22.

Hereinafter, a method for manufacturing a nonvolatile storage device according to a second embodiment of this invention will be described with reference to FIGS. 21 to 27. FIGS. 21 to 23 are bird's eye views illustrating a method for manufacturing the nonvolatile storage device according to this embodiment. FIGS. 24 to 27 are cross-sectional views illustrating a method for manufacturing the nonvolatile storage device according to this embodiment.

First, as in the first embodiment, an interpoly dielectric film 30, a tungsten film that forms the word lines, an amorphous silicon layer 4a doped with p-type impurities (for example, boron (B)), an amorphous silicon layer 5a doped with impurities of the low concentration, and an amorphous silicon layer 6a doped with n-type impurities (for example, P (phosphorous)) are formed in turn on the semiconductor substrate 1 (not shown) in which the contact plugs for connecting the peripheral circuits and the word lines are formed.

Then, the films formed on the interpoly dielectric film are processed into a stripe pattern extending in the first direction to form the word lines 2 formed of the tungsten film. Since the amorphous silicon layers 4a, 5a, and 6a, and the word lines 2 are processed simultaneously in a self-alignment manner, no stack displacement occurs in the respective layers of the word lines 2, the amorphous silicon layer 4a, 5a, and 6a in the first direction, and the reliability of the memory program operation can be enhanced.

Then, as illustrated in FIG. 21, after the spaces between the respective stripe patterns including the word lines 2, and the amorphous silicon layers 4a, 5a, and 6a are embedded with the insulator films 31, the stripe patterns and the insulator films 31 except for the word lines 2 are processing into a stripe shape extending in the second direction orthogonal to the extending direction of the word lines 2. In this situation, only the insulator films 31, and the amorphous silicon layers 4a, 5a, and 6a are processed, and the word lines 2 made of tungsten are not processed. That is, the word lines 2 are held in the shape extending in the first direction.

Then, as illustrated in FIG. 22, the spaces between the respective stripe patterns including the insulator films 31 formed in the process described with reference to FIG. 21 are embedded with the insulator film 32. Thereafter, the insulator films 31 and 32 on the amorphous silicon layer 6a are removed through the CMP technique to expose the upper surface of the amorphous silicon layer 6a. As a result, an amorphous silicon pillar including the word lines 2 and the amorphous silicon layers 4a to 6a formed to be self-aligned to the word lines 2 is formed.

In the following bird's eye view, for facilitation to understand the drawing, the interpoly dielectric film 30, and the insulator films 31, 32 are omitted.

Then, as illustrated in FIG. 23, the insulator film 11, the amorphous silicon layer 21a, the insulator film 12, the amorphous silicon layer 22a, the insulator film 13, the amorphous silicon layer 23a, the insulator film 14, the amorphous silicon layer 24a, the insulator film 15, and the amorphous silicon layer 25a are formed on the amorphous silicon layer 6a in order.

Thereafter, holes 50 are formed to extend from an upper surface of the stacked film formed on the amorphous silicon layer 6a to respective upper surfaces of the amorphous silicon layers 6a configuring the amorphous silicon pillars.

In this situation, an area of the upper surface of each amorphous silicon layer 6a may be substantially identical with an area of a bottom surface of each hole 50. However, a space between the adjacent amorphous silicon layers 6a in a direction along the main surface of the semiconductor substrate 1 (not shown) may be reduced to increase the area of the upper surface of the amorphous silicon layer 6a. Alternatively, the respective widths of the amorphous silicon layer 6a in the first direction and the second direction may be larger than the respective widths of the hole 50 in the first direction and the second direction.

With the above configuration, even if the bottom of the holes 50 and the upper surface of the amorphous silicon layer 6a are displaced from each other, since the area of the upper surface of the amorphous silicon layer 6a is larger than the area of the bottom surface of the hole 50, a margin of misalignment can be ensured. Also, a variation of the contact area between the upper surface of the amorphous silicon layer 6a and the polysilicon surface which is the channel semiconductor layer embedded in the hole 50 can be also reduced, and the contact area between the polysilicon layer and the upper surface portion of the amorphous silicon layer 6a can be prevented from being reduced.

Figure 24:
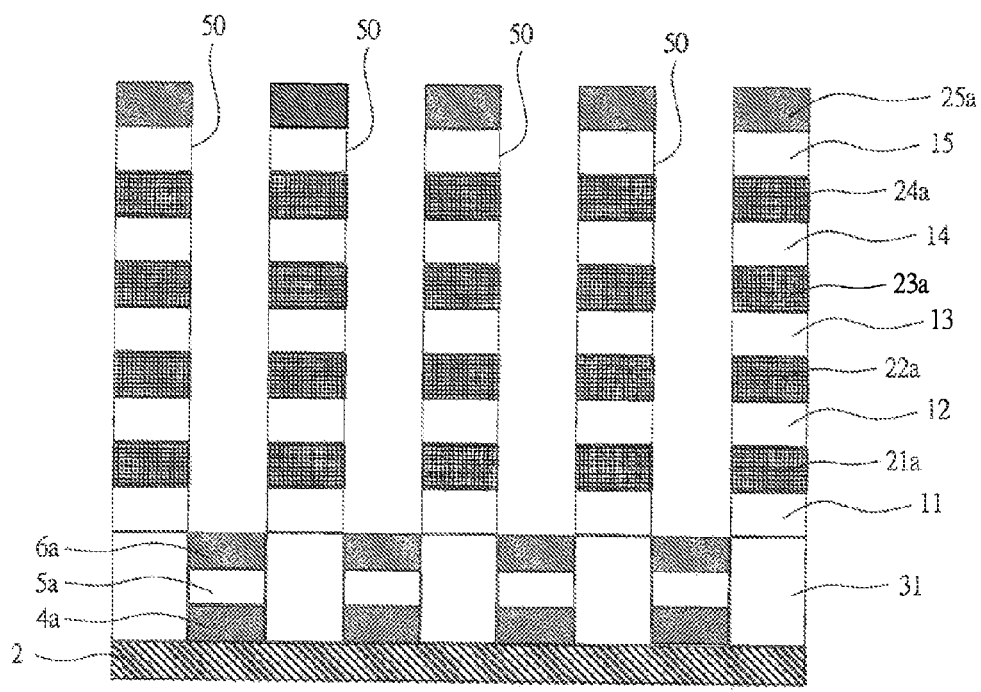
FIG. 24 is a cross-sectional view illustrating the method for manufacturing the vertical chain memory subsequent to FIG. 22.

Also, a cross-sectional view along the extending direction of the word lines 2 in FIG. 23 is illustrated in FIG. 24. FIG. 24 illustrates a cross-sectional view taken along the first direction which is different from the respective cross-sectional views illustrated in FIGS. 7 to 19. As illustrated in FIG. 24, the respective holes 50 are formed immediately above the plurality of amorphous silicon layers 4a to 6a arranged on the word lines 2 at given intervals.

Figure 25:
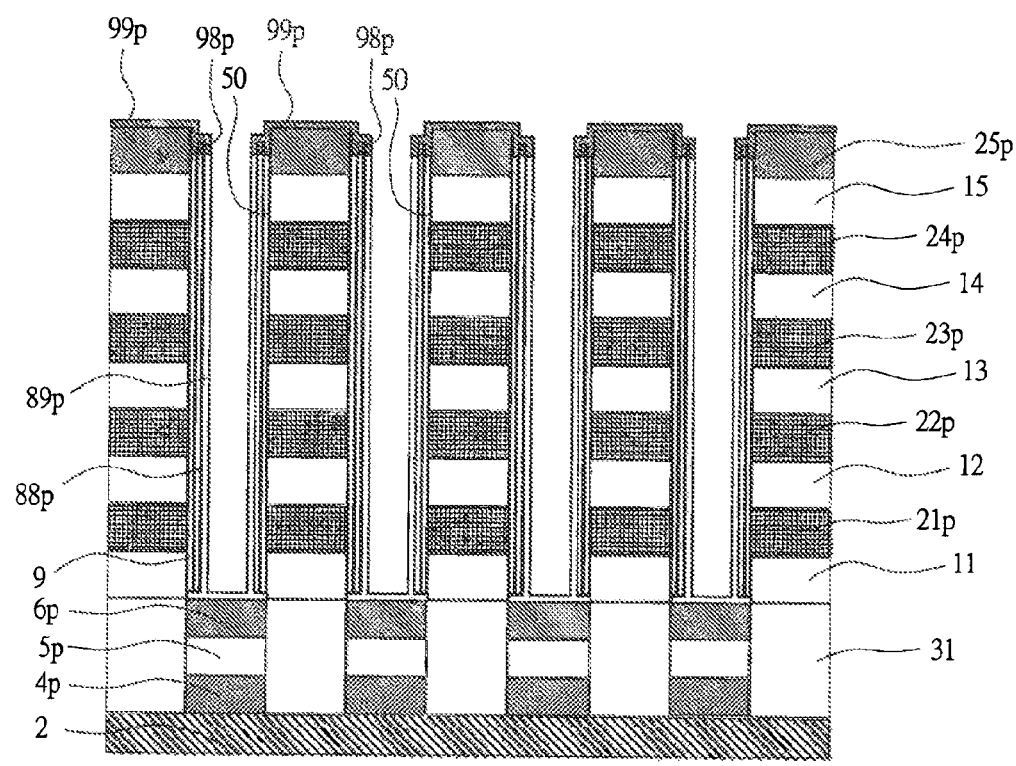
FIG. 25 is a cross-sectional view illustrating the method for manufacturing the vertical chain memory subsequent to FIG. 24.

Thereafter, with the execution of the same processes as those in FIGS. 8 to 13, as illustrated in FIG. 25, the diffusion layer including the polysilicon layer 25p, and the channel semiconductor layer including the polysilicon layers 88p and 89p can be formed. The height of the uppermost surface of the insulator film 9 is set to be higher than the height of the uppermost surface of the polysilicon layer 24p.

Figure 26:
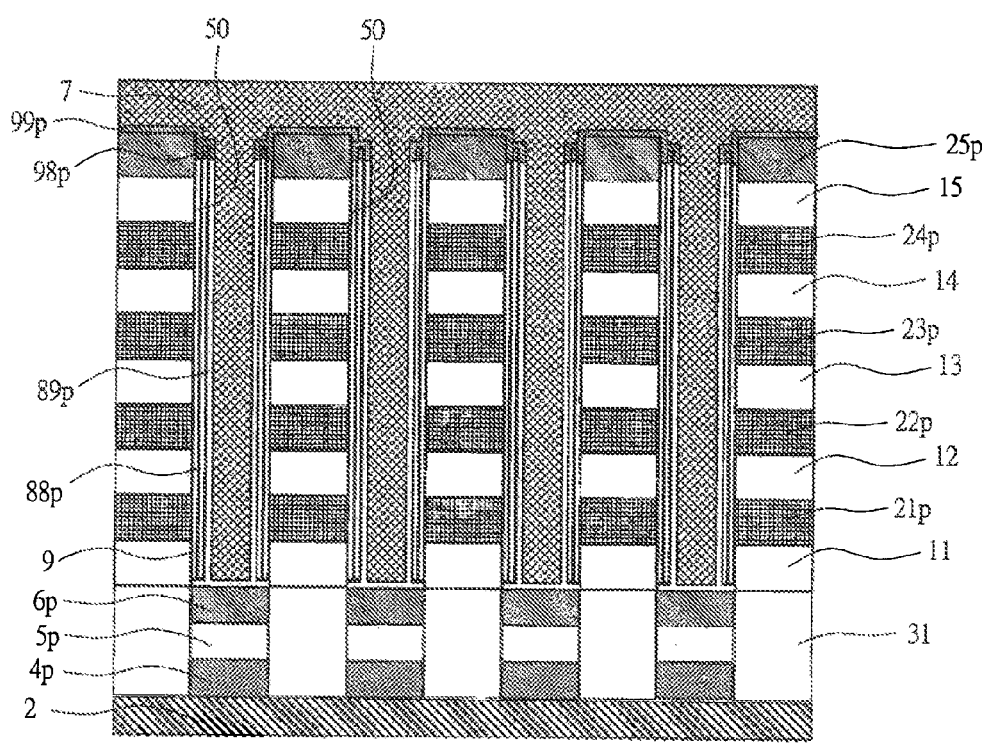
FIG. 26 is a cross-sectional view illustrating the method for manufacturing the vertical chain memory subsequent to FIG. 25.

Then, as illustrated in FIG. 26, after a thin insulator film (not shown) has been formed on the polysilicon layers 89p and the polysilicon layers 99p, the phase change material film 7 is so formed as to be completely embedded in the holes 50.

In the above process, the holes 50 is not completely embedded with the phase change material film 7, and an insulating film is further formed on the phase change material film 7 so as to be completely embedded in the holes 50 so that the insulator film that contacts with the phase change material film 7 is formed in the center of the hole. In this structure, when, in the memory operation, the gate of the cell transistor, that is, any one of the polysilicon layer 21p to 24p turns off, and a current flows in the phase change material film 7, because the insulator film is formed in the interior of the phase change material film 7, no current flows in a portion where the insulator film is formed. Accordingly, the path of current flowing into the phase change material film 7 is partially restricted, and a region that undergoes a change in the resistivity of the phase change material film 7 can be reduced. As a result, because the phase change of the phase change material film 7 can be conducted with a small current, an electric power necessary for the memory operation can be reduced.

Figure 27:
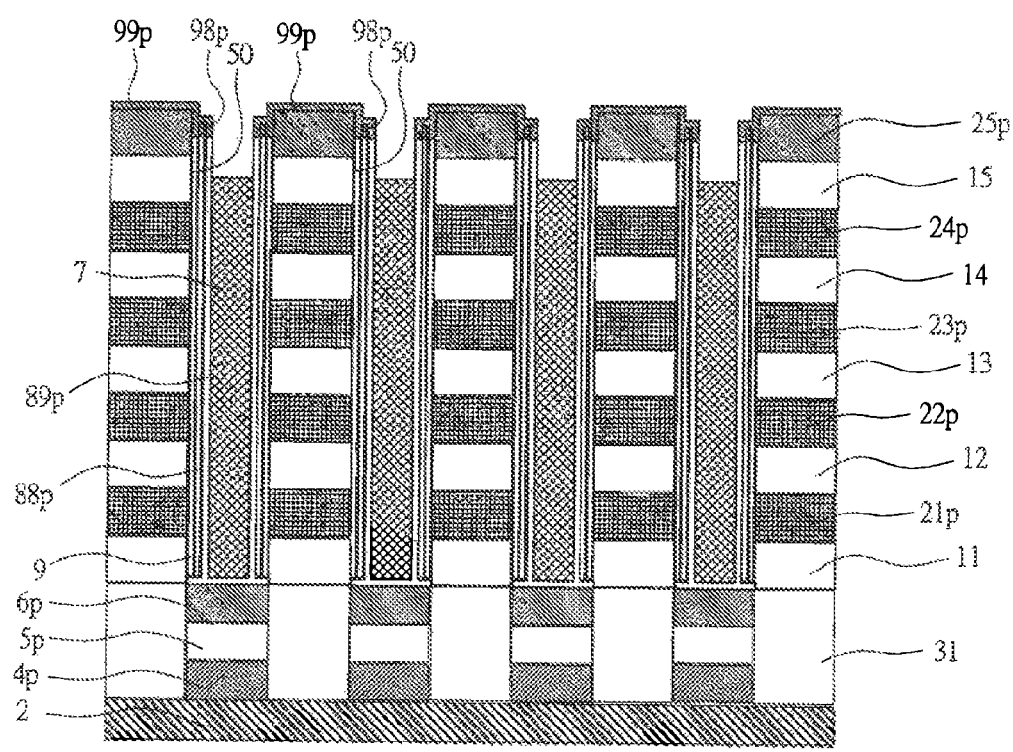
FIG. 27 is a cross-sectional view illustrating the method for manufacturing the vertical chain memory subsequent to FIG. 26.

Then, as illustrated in FIG. 27, the upper portion of the phase change material film 7 is removed by etch-back. In this situation, the height of the uppermost surface of the phase change material film 7 is set to be lower than the uppermost surface of the insulator film 15.

Although the subsequent processes are not illustrated, the insulator film 91 (refer to FIG. 1) is first formed on the overall main surface of the semiconductor substrate 1, and embedded in the holes 50 of the phase change material film 7. Thereafter, the insulator film 91 is etched back to expose the upper surface of the diffusion layer including the polysilicon layers 25p and 99p. Subsequently, after the contact plug BLC illustrated in FIG. 19 has been formed, the metal films 3a, 3b, and 3c are formed on the diffusion layer in order from the semiconductor substrate 1 side. Then, the metal films 3a to 3c, and the n-type polysilicon layers 99p, 25p are processed into a stripe shape extending in the second direction, and the uppermost surface of the insulator film 15 is exposed to form the bit lines 3 formed of the metal films 3a to 3c.

Thereafter, the polysilicon layers 21p to 24p are processed so as to form the contact plugs connected to the respective layers of the polysilicon layers 21p to 24p. After the overall structure on the semiconductor substrate 1 has been embedded with the interpoly dielectric film, the contact plugs extending to the polysilicon layers 21p to 24p are formed. Then, the lines GL1, GL2, GL3, GL4, STGL1, and STGL2 are formed on the contact plugs. Subsequently, after the contact plugs that connect the lines GL1 to GL4, STGL1, and STGL2 to the peripheral circuits are formed, the global bit line GBL is formed on the line GL1, to thereby complete the nonvolatile storage device according to this embodiment illustrated in FIG. 19.

In this embodiment, the four polysilicon layers serving as the gate electrodes and the gate lines are stacked together. However, the number of stacks is not limited to four layers, but the number of stacks can be arbitrarily determined.

In the nonvolatile storage device according to this embodiment, even if the thickness of the polysilicon layer 99p (refer to FIG. 19) which is the channel semiconductor layer is thinned, the contact resistance between the diffusion layer on top of the vertical transistor configuring the vertical chain memory and the bit lines 3 can be prevented from rising, and can be sufficiently reduced. For that reason, the nonvolatile storage device can be stably conducted, and the reliability of the nonvolatile storage device can be improved.

Third Embodiment

In the first embodiment and the second embodiment, a description is given of the nonvolatile storage device including the phase change memory in which after the insulator film 9 that is the gate insulator film has been formed, the phase change material film 7 which is a memory material layer forming the memory film is formed on the surface of the channel semiconductor layer including the polysilicon layers 88p and 89p through the insulator film which is a reaction prevention layer into the phase change memory. On the contrary, in this embodiment, a description will be given of the nonvolatile storage device using no variable resistance material such as the phase change material film formed with the insulator film 9, for example, as a laminated film of oxide silicon film/nitride silicon film/oxide silicon film, and with the nitride silicon film as the charge storage film.

In the case of the device using the charge storage film as described above, there is no use of a material deteriorated by the formation of the silicon layer such as the phase change material and a thermal load of crystallization. Therefore, as in NPL 1, after the formation of the memory cell, the channel diffusion layer and the contact of a low contact resistance can be formed by the silicon plug. However, a mask needs to be used for the formation of the silicon plug, and there arises such a problem that the costs increase due to an increase in the number of processes.

In a process of manufacturing the nonvolatile storage device according to this embodiment, the same processes as those in FIGS. 7 to 13 according to the first embodiment are conducted. The insulator film 9 is of a stacked structure of the oxide silicon film/nitride silicon film/oxide silicon film. Then, as shown in FIG. 13, the spaces between the respective plural stacked films including the insulator films 11 to 15, and 71, and the polysilicon layers 21p to 25p are embedded with an insulator film, and the upper portion of the insulator film is removed by etch-back in the same process as that described with reference to FIG. 15 to expose the uppermost surface of the diffusion layer including the polysilicon layers 25p and 99p. The subsequent process is conducted in the same manner as that of the first embodiment to complete the nonvolatile storage device according to this embodiment. As a result, since the contact area of the bit lines 3 (refer to FIG. 1) and the diffusion layer can be largely ensured, the contact resistance of the diffusion layer in the vertical chain memory can be sufficiently lessened as in the first embodiment.

Likewise, in the process illustrated in FIG. 25 according to the second embodiment, the insulator film 9 can be of a stacked structure of the oxide silicon film/nitride silicon film/oxide silicon film.

In the nonvolatile storage device according to the third embodiment, as in the first embodiment and the second embodiment, even if the thickness of the channel semiconductor layer is thinned, the contact resistance between the diffusion layer of the vertical chain memory and the bit line can be sufficiently reduced. Accordingly, because the operation of the vertical chain memory can be stably conducted, the reliability of the nonvolatile storage device can be improved.

The invention made by the present inventors has been described on the basis of the embodiments in detail. However, this invention is not limited to the above embodiment, and can be variously modified without departing from the spirit of this invention.

For example, in the above first to third embodiments, it is assumed that the polysilicon layer that conducts the gate operation and the channel forming the source/drain path are made of polysilicon. However, the material of the polysilicon layer is not restricted, but the present invention can be realized by application of the semiconductor material that can conduct the gate operation. Also, the material of the conductive layer functioning as the gate may be, for example, a metal film.

Further, in the first to third embodiments, for facilitation of description, the expressions of the word lines and the bit lines are used. Those lines are select lines used for selecting one vertical chain memory. Accordingly, the positional relationship may be reversed. Further, it is needless to say that there is no need to connect a read circuit such as a sense amplifier to the bit line side.

INDUSTRIAL APPLICABILITY

The method of producing the non-volatile storage device according to this invention is extensively used for the non-volatile storage device having the vertical transistor that selects the memory cells.

REFERENCE SIGN LIST 1, semiconductor substrate
2, word line
3, bit line
3a to 3c, metal film
4a to 6a, amorphous silicon layer
4p to 6p, polysilicon layer
7, phase change material film
9 to 15, 71, insulator film
21a to 25a, amorphous silicon layer
21p to 25p, polysilicon layer
30, interpoly dielectric film
31 to 33, insulator film
50, hole
61a, amorphous silicon layer
61p, polysilicon layer
88a, 89a, amorphous silicon layer
88p, 89p, 98p, 99p, polysilicon layer
91, 92, insulator film
BL1 to BL4, bit line
BLC, contact plug
C1, C2, contact plug
DIF, diffusion layer
GATE, gate electrode
GBL, global bit line
GBLC, contact plug
GL1 to GL4, line
GOX, gate insulator film
ILD1 to ILD6, interpoly dielectric film
M1, M2, line layer
MA, memory cell array
PD, polysilicon diode
SMC, select cell
STGL1, STGL2, line
STI, isolation layer
USMC1 to USMC3, unselected cell
WL1 to WL3, word line

The invention claimed is:

1. A nonvolatile storage device, comprising:
a first conductive layer formed on a semiconductor substrate, and extended in a first direction along a main surface of the semiconductor substrate;
a select element formed on the first conductive layer, and electrically connected to the first conductive layer;
a stacked film including (N+1) (N is an integer of N≥1) first insulator films and N second conductive layers alternately stacked on the select element;
a first semiconductor layer and a memory material layer which are formed on a sidewall of the stacked film through a second insulator film, and electrically connected to the select element;
a third conductive layer formed on the stacked film, but not directly over the first semiconductor layer and the memory material layer in a stacking direction of the stacked film, and electrically connected to the first semiconductor layer; and
a fourth conductive layer formed on the third conductive layer, electrically connected to the third conductive layer, and extended in a second direction orthogonal to the first direction.

2. The nonvolatile storage device according to claim 1, wherein a second semiconductor layer, having at least a portion formed in a different process than the first semiconductor layer, is formed between the first semiconductor layer and the second insulator film along the sidewall of the staked film.

3. The nonvolatile storage device according to claim 2, wherein an uppermost surface of the second semiconductor layer is located in a region higher than a height of an uppermost surface of the second insulator film.

4. The nonvolatile storage device according to claim 1, wherein the third conductive layer comes in direct contact with the fourth conductive layer.

5. The nonvolatile storage device according to claim 1, wherein the memory material layer includes a variable resistance material, and is formed on the sidewall through the first semiconductor layer.

6. The nonvolatile storage device according to claim 1, wherein an uppermost surface of the second insulator film is located in a region lower than a bottom surface of the third conductive layer, and higher than an upper surface of the second conductive layer.

7. The nonvolatile storage device according to claim 1, wherein a third insulator film is formed between the memory material layer and the first semiconductor layer.

8. The nonvolatile storage device according to claim 1, wherein the memory material layer includes a charge storage film, and is formed between the second insulator film and the first semiconductor layer.

9. The nonvolatile storage device according to claim 1, wherein the stacked film has a hole extending from an upper surface of the stacked film to an upper surface of the select element in a region immediately above the first conductive layer and immediately below the fourth conductive layer, and
wherein the second insulator film and the first semiconductor layer are formed within the hole and on the sidewall of the stacked film.

* * * * *